United States Patent
Kim et al.

(10) Patent No.: US 12,317,504 B2
(45) Date of Patent: May 27, 2025

(54) SEMICONDUCTOR MEMORY DEVICE INCLUDING VERTICAL CELL STRUCTURE AND METHOD OF FABRICATING THE SAME

(71) Applicant: Samsung Electronics Co., Ltd., Suwon-si (KR)

(72) Inventors: Hyuncheol Kim, Seoul (KR); Yongseok Kim, Suwon-si (KR); Dongsoo Woo, Seoul (KR); Sungwon Yoo, Hwaseong-si (KR); Kyunghwan Lee, Seoul (KR); Jaeho Hong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 497 days.

(21) Appl. No.: 17/671,533

(22) Filed: Feb. 14, 2022

(65) Prior Publication Data
US 2022/0367514 A1    Nov. 17, 2022

(30) Foreign Application Priority Data

May 12, 2021    (KR) .................. 10-2021-0061291

(51) Int. Cl.
*H10B 51/20*    (2023.01)
*H10B 51/10*    (2023.01)

(52) U.S. Cl.
CPC ............. *H10B 51/20* (2023.02); *H10B 51/10* (2023.02)

(58) Field of Classification Search
CPC ........ H10B 51/20; H10B 51/10; H10B 51/50; H10B 51/30; H01L 29/78391

USPC .......................................................... 257/66
See application file for complete search history.

(56) References Cited

U.S. PATENT DOCUMENTS

| | | | |
|---|---|---|---|
| 7,777,268 B2 | 8/2010 | Walker | |
| 7,982,252 B2 | 7/2011 | Kang | |
| 9,530,794 B2 | 12/2016 | Ramaswamy et al. | |
| 9,818,848 B2 | 11/2017 | Sun et al. | |
| 10,651,182 B2 | 5/2020 | Morris et al. | |
| 10,833,101 B2 | 11/2020 | Shimomura et al. | |

(Continued)

FOREIGN PATENT DOCUMENTS

| | | |
|---|---|---|
| KR | 101872122 B1 | 6/2018 |
| KR | 102134089 B1 | 7/2020 |
| TW | 202042236 A | 11/2020 |

*Primary Examiner* — Mohammad M Hoque
(74) *Attorney, Agent, or Firm* — Muir Patent Law, PLLC

(57) ABSTRACT

A semiconductor memory device may include a stack including word lines and interlayer insulating patterns alternatingly stacked on a substrate, the word lines being extended in a first direction parallel to a top surface of the substrate, semiconductor patterns crossing the word lines and having a long axis extended in a second direction parallel to the top surface of the substrate, data storage patterns respectively interposed between the semiconductor patterns and the word lines, the data storage patterns including a ferroelectric material, bit lines extended in a third direction perpendicular to the top surface of the substrate and spaced apart from each other in the first direction, each of the bit lines being in contact with first side surfaces of the semiconductor patterns spaced apart from each other in the third direction, and a source line in contact with second side surfaces of the semiconductor patterns.

20 Claims, 37 Drawing Sheets

(56) References Cited

U.S. PATENT DOCUMENTS

| | | |
|---|---|---|
| 11,158,718 B2 | 10/2021 | Greenlee et al. |
| 2010/0051578 A1* | 3/2010 | Chang ................. H01L 21/7682 |
| | | 216/17 |
| 2014/0054538 A1* | 2/2014 | Park ..................... H10B 63/845 |
| | | 257/5 |
| 2016/0141337 A1* | 5/2016 | Shimabukuro .... H10N 70/8845 |
| | | 365/51 |
| 2018/0358380 A1 | 12/2018 | Yoo |
| 2020/0013791 A1 | 1/2020 | Or-Bach et al. |
| 2020/0126908 A1 | 4/2020 | Kim |
| 2020/0279601 A1* | 9/2020 | Kim ..................... H10B 12/30 |
| 2021/0020659 A1 | 1/2021 | Chen |
| 2021/0111190 A1 | 4/2021 | Lee et al. |
| 2022/0246619 A1* | 8/2022 | Kim ................. H01L 29/78696 |

\* cited by examiner

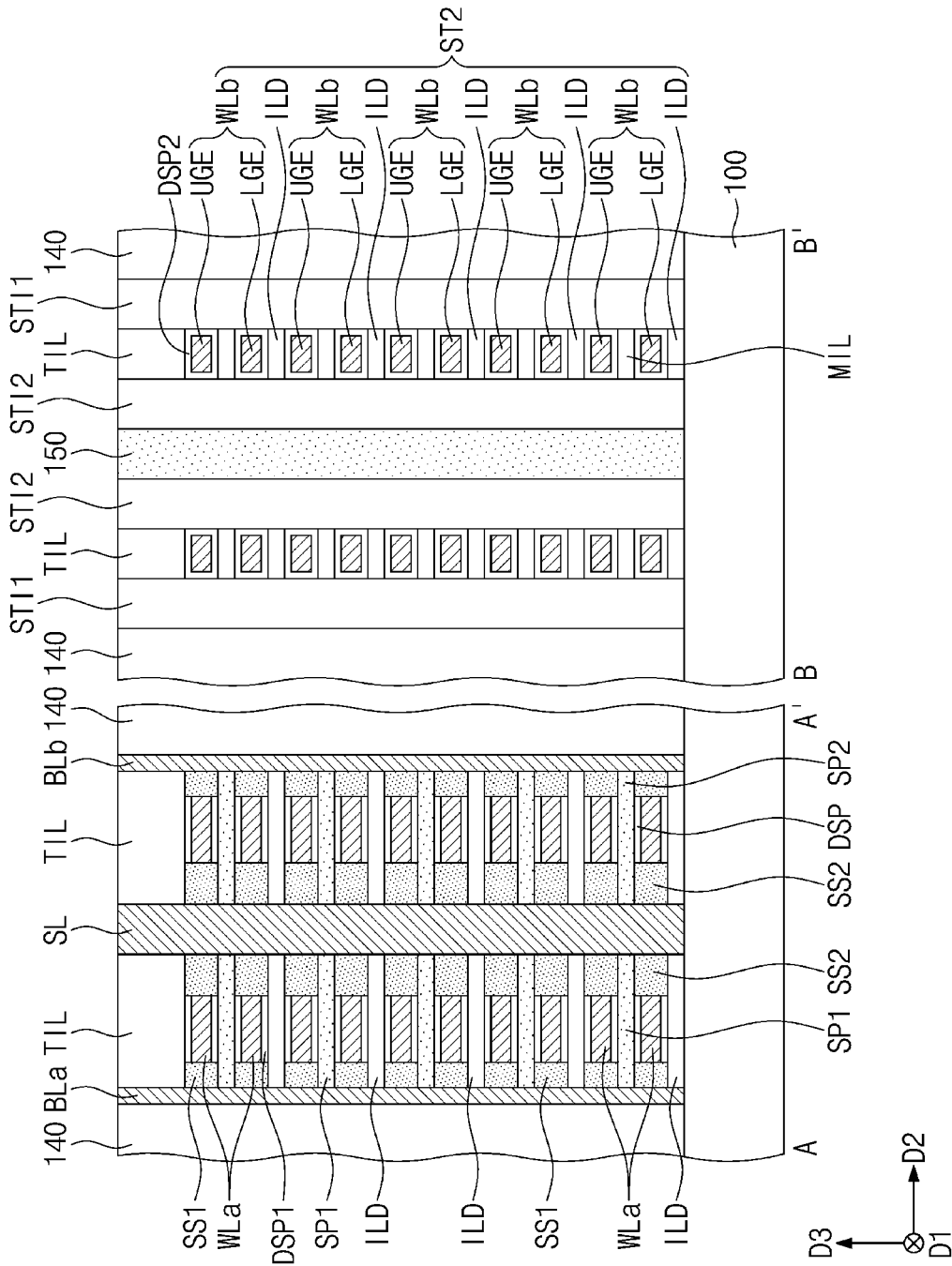

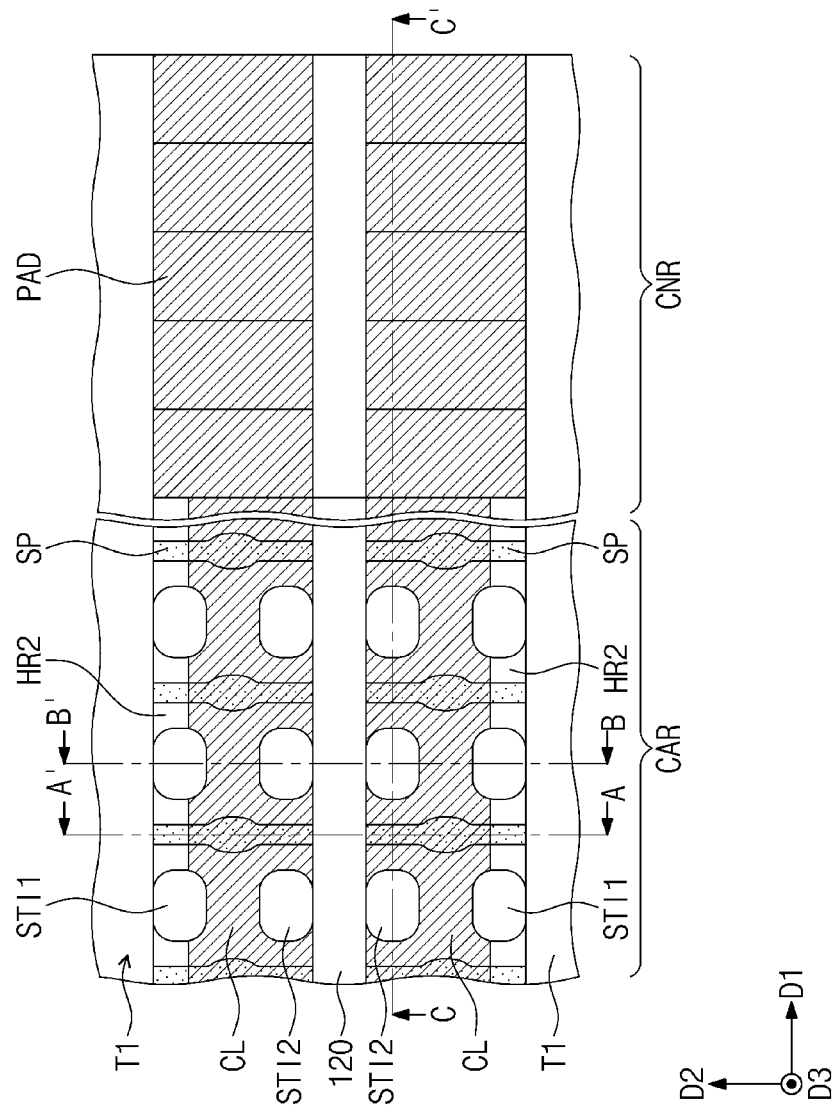

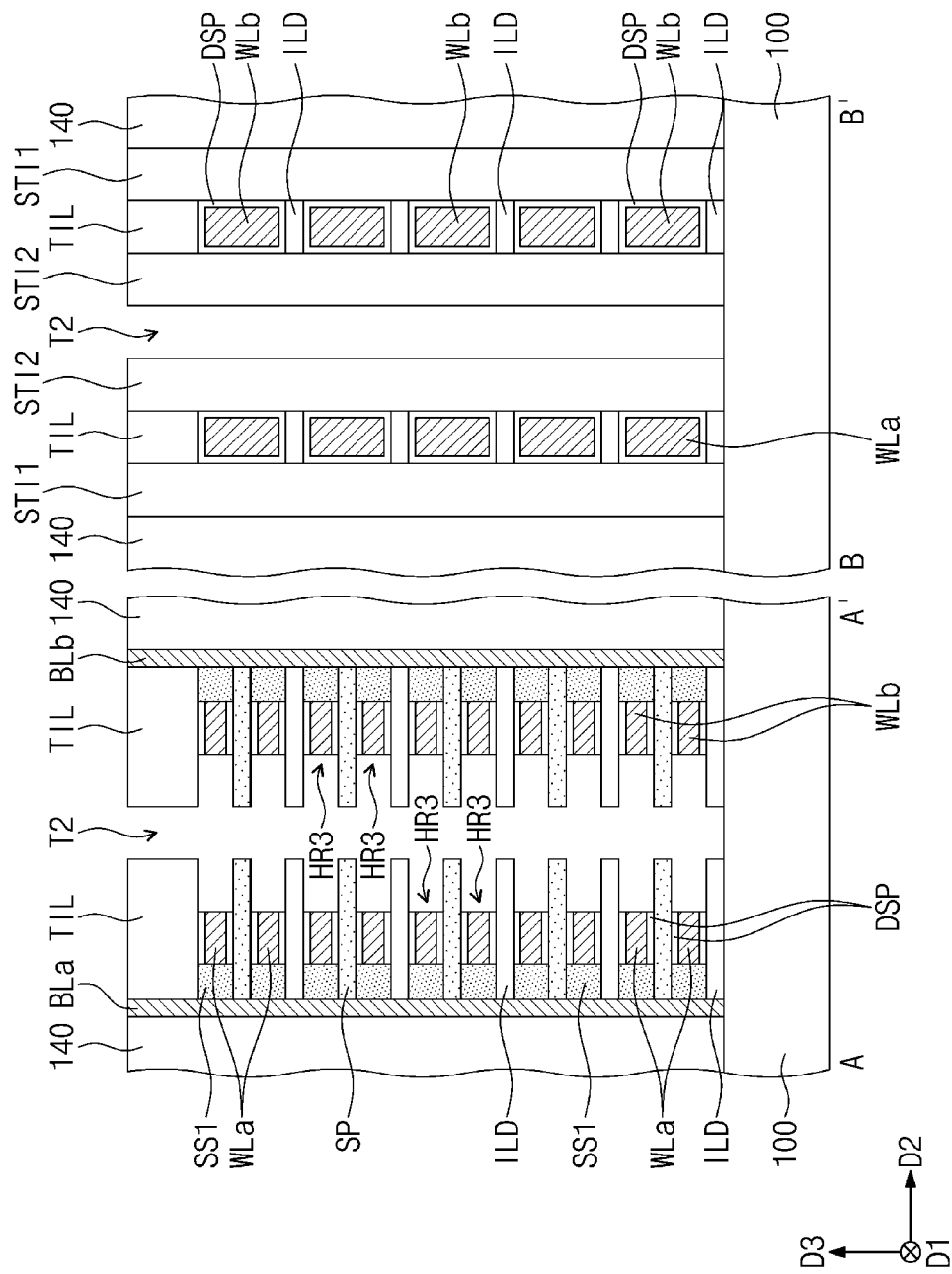

SEMICONDUCTOR MEMORY DEVICE INCLUDING VERTICAL CELL STRUCTURE AND METHOD OF FABRICATING THE SAME

CROSS-REFERENCE TO RELATED APPLICATION(S)

This U.S. non-provisional patent application claims priority under 35 U.S.C. § 119 to Korean Patent Application No. 10-2021-0061291, filed on May 12, 2021, in the Korean Intellectual Property Office, the disclosure of which is incorporated in its entirety by reference herein.

BACKGROUND

The present disclosure relates to a semiconductor memory device and a method of fabricating the same, and in particular, to a semiconductor memory device with improved electric characteristics and a method of fabricating the same.

Higher integration of semiconductor devices is used to satisfy consumer demands for superior performance and inexpensive prices. In the case of semiconductor devices, since their integration is an important factor in determining product prices, increased integration is especially needed. In the case of two-dimensional or planar semiconductor devices, since their integration may be mainly determined by the area occupied by a unit memory cell, integration may be greatly influenced by the level of a fine pattern forming technology. However, the extremely expensive process equipment needed to increase pattern fineness sets a practical limitation on increasing integration for two-dimensional or planar semiconductor devices. Thus, three-dimensional semiconductor memory devices including three-dimensionally arranged memory cells have recently been proposed.

SUMMARY

An embodiment of the inventive concept provides a semiconductor memory device with improved electric characteristics.

An embodiment of the inventive concept provides a method of easily fabricating a semiconductor memory device.

According to an embodiment of the inventive concept, a semiconductor memory device may include a stack including word lines and interlayer insulating patterns, which are alternatingly stacked on a substrate, the word lines being extended in a first direction parallel to a top surface of the substrate, semiconductor patterns crossing the word lines and having a long axis extended in a second direction parallel to the top surface of the substrate, data storage patterns respectively interposed between the semiconductor patterns and the word lines, the data storage patterns including a ferroelectric material, bit lines, which are extended in a third direction perpendicular to the top surface of the substrate and are spaced apart from each other in the first direction, each of the bit lines being in contact with first side surfaces of the semiconductor patterns spaced apart from each other in the third direction, and a source line in contact with second side surfaces of the semiconductor patterns, which are opposite to the first side surfaces in the second direction and are spaced apart from each other in the third direction.

According to an embodiment of the inventive concept, a semiconductor memory device may include a semiconductor pattern having a long axis, which is extended in a second direction parallel to a top surface of a substrate, a word line provided to surround the semiconductor pattern and extended in a first direction perpendicular to the second direction and parallel to the top surface of the substrate, a bit line contacting a first side surface of the semiconductor pattern and extended in a third direction perpendicular to the top surface of the substrate, a source line contacting a second side surface of the semiconductor pattern opposite to the first side surface in the second direction and extended in the third direction, and a data storage pattern disposed between the semiconductor pattern and the word line.

According to an embodiment of the inventive concept, a semiconductor memory device may include a first stack extending in a first direction and including first interlayer insulating patterns and first word lines, which are alternately stacked on a substrate, a second stack extending in the first direction and including second interlayer insulating patterns and second word lines, which are alternately stacked on the substrate, first semiconductor patterns crossing the first word lines and having a long axis extended in a second direction perpendicular to the first direction and parallel to a top surface of the substrate, first ferroelectric layers surrounding the first semiconductor patterns, first gate insulating layers between the first semiconductor patterns and the first ferroelectric layer, second semiconductor patterns crossing the second word lines and having a long axis extended in the second direction, second ferroelectric layers surrounding the second semiconductor patterns, second gate insulating layers between the second semiconductor patterns and the second ferroelectric layers, first bit lines extended in a third direction perpendicular to the top surface of the substrate and spaced apart from each other in the first direction, each of the first bit lines contacting first side surfaces of the first semiconductor patterns spaced apart from each other in the third direction, second bit lines extended in the third direction perpendicular to the top surface of the substrate and spaced apart from each other in the first direction, each of the second bit lines contacting first side surfaces of the second semiconductor patterns spaced apart from each other in the third direction, a source line extended in the third direction between the first and second stacks and contacting in common second side surfaces of the first semiconductor patterns spaced apart from each other in the third direction and second side surfaces of the second semiconductor patterns spaced apart from each other in the third direction, first insulating isolation patterns provided between the first bit lines adjacent to each other in the first direction and between the second bit lines adjacent to each other in the first direction and extended in the third direction, and second insulating isolation patterns, which are spaced apart from the first insulating isolation patterns in the second direction and are extended in the third direction.

According to an embodiment of the inventive concept, a method of fabricating a semiconductor memory device may include forming a mold structure, in which a plurality of stacks are stacked, on a substrate, each of the stacks including an interlayer insulating layer, a first sacrificial layer, a semiconductor layer, and a second sacrificial layer, which are sequentially stacked, forming first and second openings to penetrate the mold structure, the first openings being spaced apart from each other in a first direction, the second openings being spaced apart from the first openings in a second direction crossing the first direction, isotropically etching the semiconductor layers of the stacks exposed through the first and second openings to divide the semiconductor layer into a plurality of semiconductor patterns, which are spaced apart from each other in the first direction, forming first insulating isolation patterns and second insulating isolation patterns in the first and second openings, respectively, after the forming of the semiconductor patterns, forming a first trench to extend in the first direction and to penetrate the mold structure, the first trench exposing a side surface of the mold structure and the first insulating isolation patterns, removing the first and second sacrificial layers of the stacks, which are exposed by the first trench, to form horizontal recess regions exposing the semiconductor patterns, sequentially forming a ferroelectric layer and a gate conductive layer in each of the horizontal recess regions, forming bit lines, which are extended in a third direction perpendicular to a top surface of the substrate and contact first side surfaces of the semiconductor patterns spaced apart from each other in the third direction, and forming source lines, which are extended in the third direction and contact second side surfaces of the semiconductor patterns spaced apart from each other in the third direction.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 6A is a sectional view, which is taken along the lines A-A' and B-B' of FIG. 2 to illustrate a semiconductor memory device according to an embodiment of the inventive concept.

FIGS. 11A to 19A are plan views illustrating a method of fabricating a semiconductor memory device according to an embodiment of the inventive concept.

FIGS. 11B to 19B are sectional views, which are taken along lines A-A' and B-B' of FIGS. 11A to 19A to illustrate a method of fabricating a semiconductor memory device according to an embodiment of the inventive concept.

FIGS. 11C to 17C are sectional views, which are taken along line C-C' of FIGS. 11A to 17A to illustrate a method of fabricating a semiconductor memory device according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
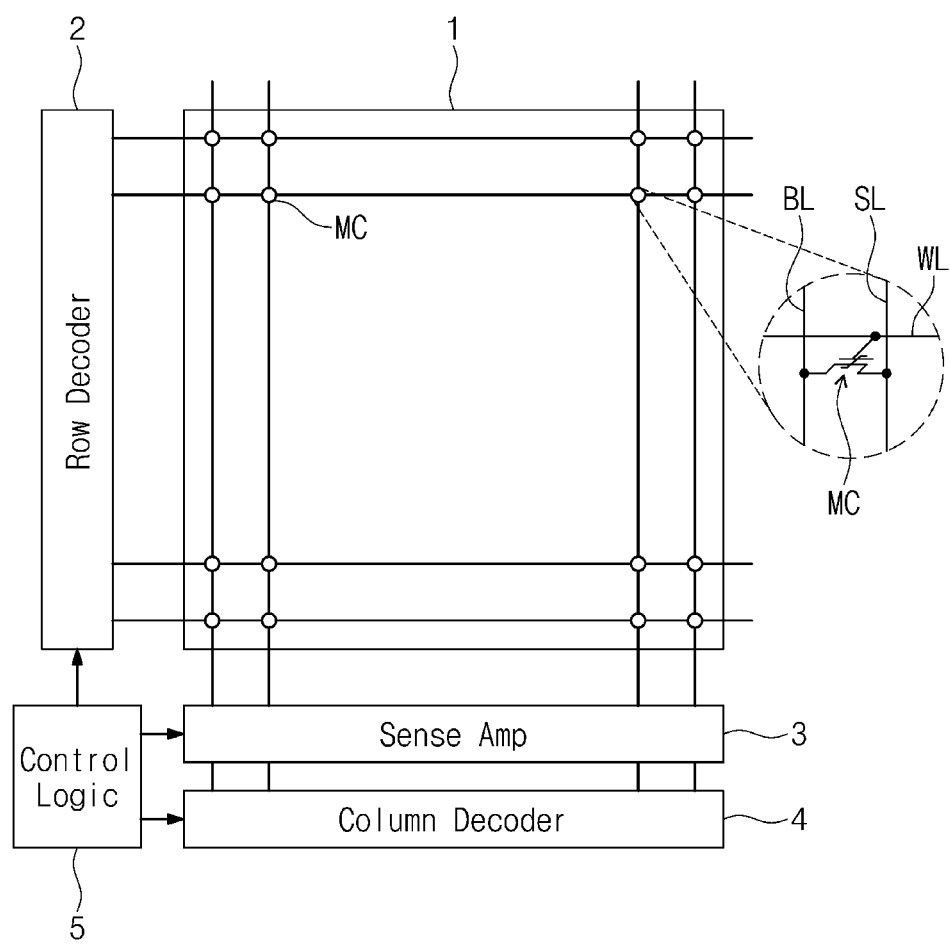
FIG. 1 is a circuit diagram schematically illustrating a cell array of a semiconductor memory device according to an embodiment of the inventive concept.

FIG. 1 is a circuit diagram schematically illustrating a cell array of a semiconductor memory device according to an embodiment of the inventive concept.

Referring to FIG. 1, a semiconductor memory device may include a memory cell array 1, a row decoder 2, a sensing amplifier 3, a column decoder 4, and a control logic 5.

The memory cell array 1 may include a plurality of memory cells MC, which are three-dimensionally arranged. Each of the memory cells MC may be composed of one transistor including a memory layer. Each of the memory cells MC may be connected to one word line WL, one bit line BL, and one source line SL.

Each of the memory cells MC may include a ferroelectric field effect transistor (FeFET). Each of the memory cells MC may include a ferroelectric layer, which is used as the memory layer. In each memory cell, the ferroelectric layer may have a non-centrosymmetric charge distribution and thereby may have a spontaneous dipole (i.e., spontaneous polarization). The ferroelectric layer may have a remnant polarization, which is caused by the dipole, even when there is no external electric field. Furthermore, a direction of a polarization may be switched by the external electric field, and this polarization switching operation may be performed for each domain.

In other words, the ferroelectric layer may have a positive or negative polarization state, and during a programming operation, the polarization state may be changed by an electric field applied to the ferroelectric layer. Even when a power is interrupted, the polarization state of the ferroelectric layer may be maintained, and thus, the semiconductor memory device may operate as a nonvolatile memory device.

In each memory cell MC, the polarization of the ferroelectric layer may be set to a first polarization state by applying a first voltage to a gate electrode through the word line WL and by applying a second voltage to a drain terminal through the bit line BL, where the second voltage is set to be higher than the first voltage. Accordingly, the memory layer may have the first polarization state or a positive threshold voltage. Here, a difference between the second voltage and the first voltage may be greater than the smallest value of the voltage difference that is required to set the polarization of the ferroelectric layer to the first polarization state.

The polarization of the ferroelectric layer may be set to a second polarization state by applying a third voltage to the gate electrode through the word line WL and by applying a fourth voltage, which is lower than the third voltage, to the drain terminal through the bit line BL. Accordingly, the memory layer may have the second polarization state or a negative threshold voltage. Here, a difference between the third voltage and the fourth voltage may be greater than the smallest value of the voltage difference that is required to set the polarization of the ferroelectric layer to the second polarization state.

The row decoder 2 may be configured to decode row address information, which is input from an external device (e.g., a memory controller), and to select one of the word lines WL of the memory cell array 1, based on the decoded row address information. The address information decoded by the row decoder 2 may be provided to a row driver (not shown), and in this case, the row driver may provide respective voltages to the selected one of the word lines WL and the unselected ones of the word lines WL, in response to the control of a control circuit. In some examples, the row decoder 2 may decode row address information and select one of the word lines WL of the memory cell array 1 based on a row address receiving from the control logic 5.

The sensing amplifier 3 may be configured to sense, amplify, and output a difference in voltage between one of the bit lines BL, which is selected based on address information decoded by the column decoder 4, and a reference bit line.

The column decoder 4 may provide a data transmission path between the sensing amplifier 3 and an external device (e.g., a memory controller). The column decoder 4 may be configured to decode column address information, which is input from the external deice, and to select one of the bit lines BL, based on the decoded column address information. In some examples, the column decoder 4 may decode column address information and select one of the bit lines BL based on a column address receiving from the control logic 5.

The control logic 5 may be configured to generate control signals, which are used to control a data writing or reading operation on the memory cell array 1. In some examples, the control logic 5 may receive an external address from an external device and provide the row address and the column address to the row decoder 2 and the column decoder 4, respectively.

Figure 2:
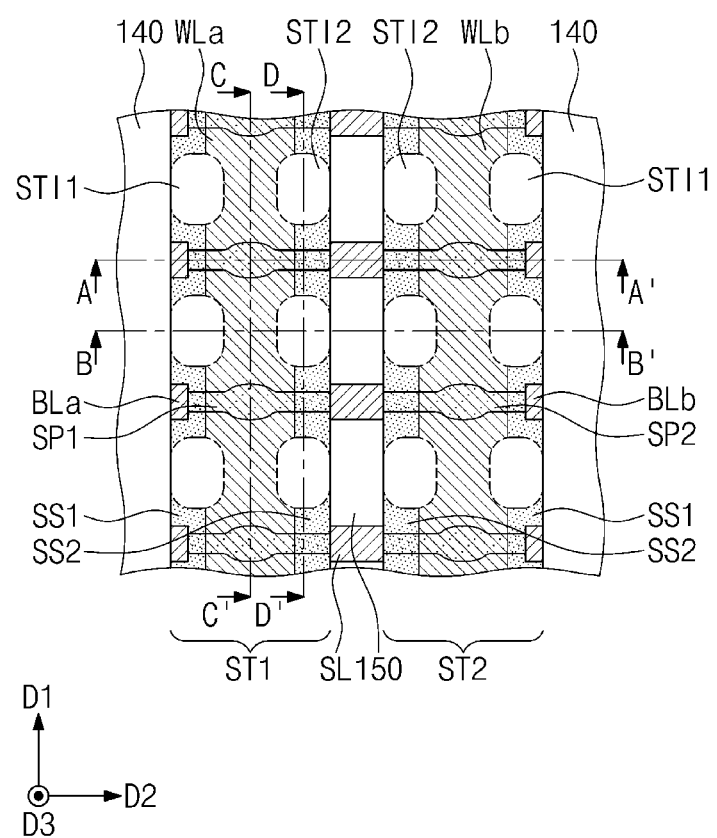
FIG. 2 is a plan view illustrating a semiconductor memory device according to an embodiment of the inventive concept.
Figure 3A:
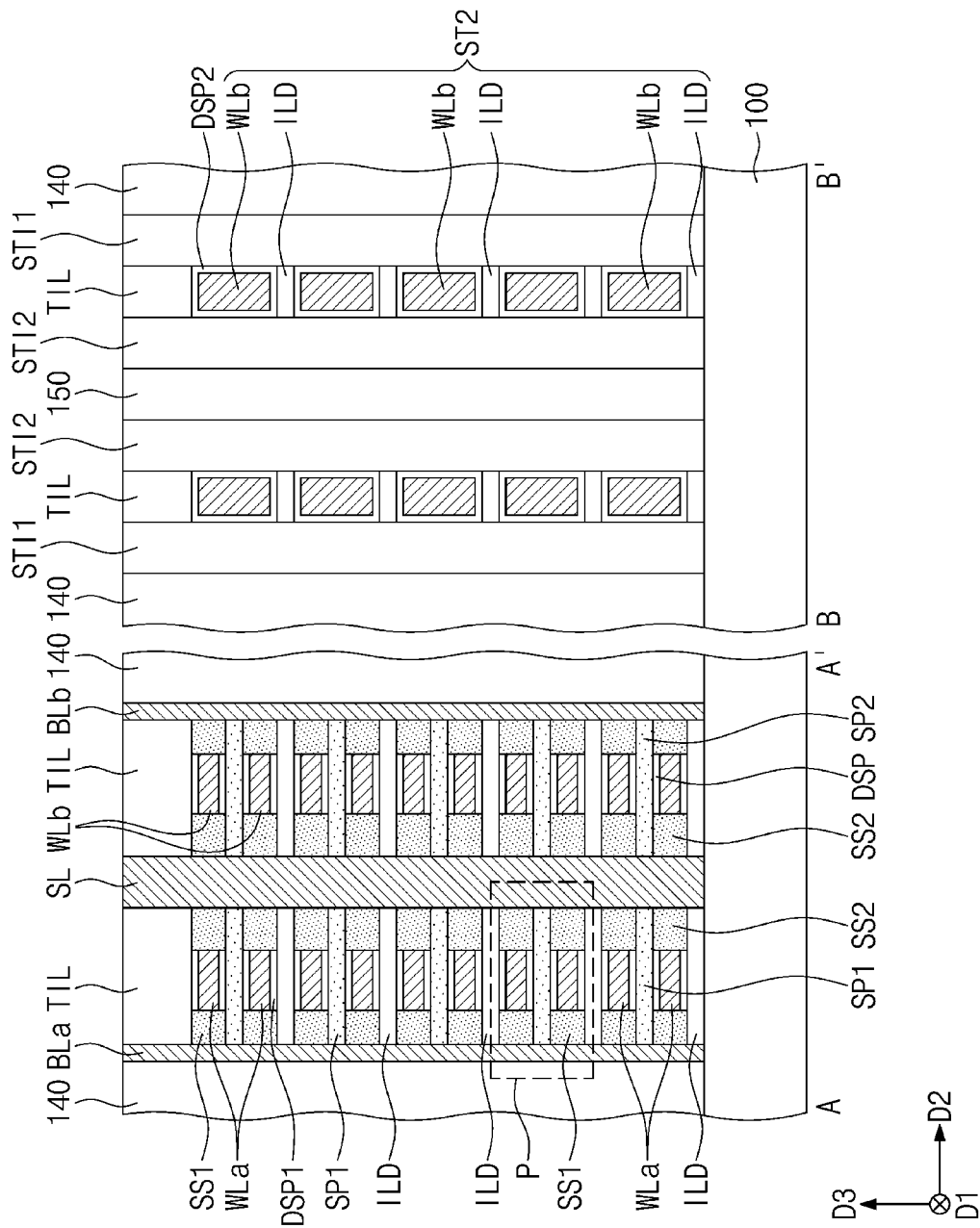
FIG. 3A is a sectional view, which is taken along lines A-A' and B-B' of FIG. 2 to illustrate a semiconductor memory device according to an embodiment of the inventive concept.
Figure 3B:
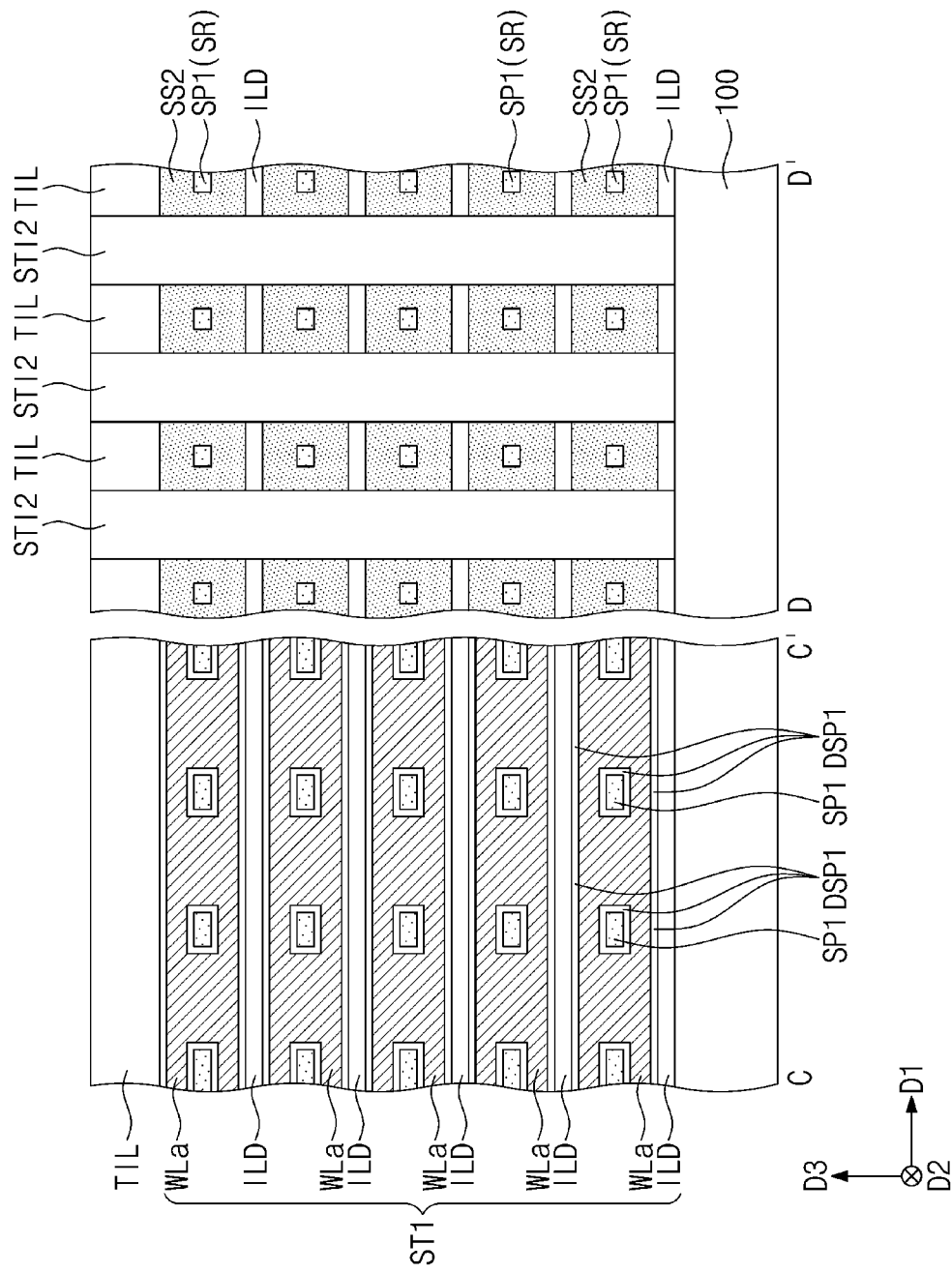
FIG. 3B is a sectional view, which is taken along lines C-C' and D-D' of FIG. 2 to illustrate a semiconductor memory device according to an embodiment of the inventive concept.
Figure 4A:
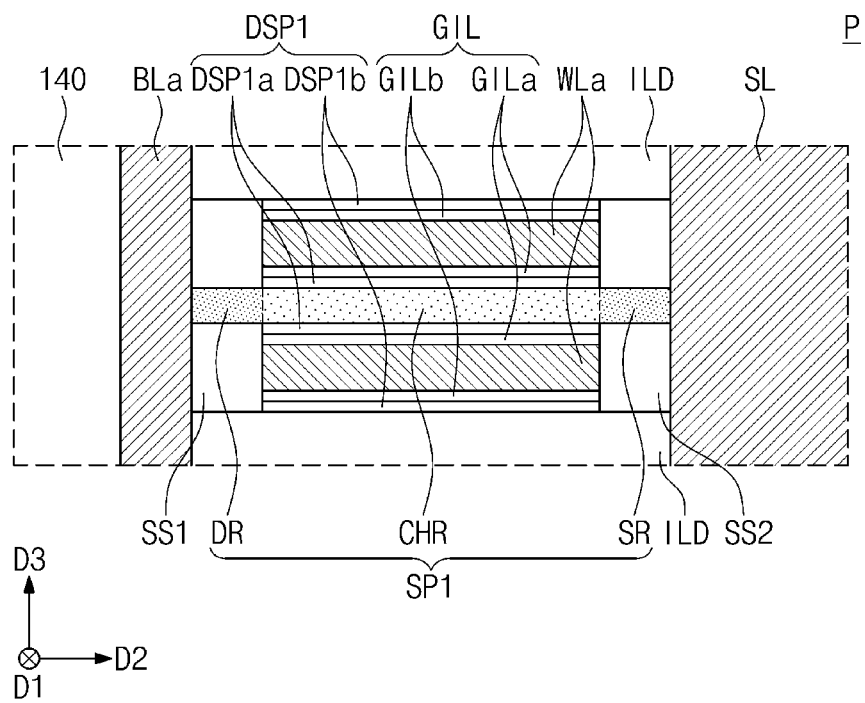
FIGS. 4A and 4B are enlarged sectional views illustrating a portion 'P' of FIG. 3A according to example embodiments.
Figure 4B:
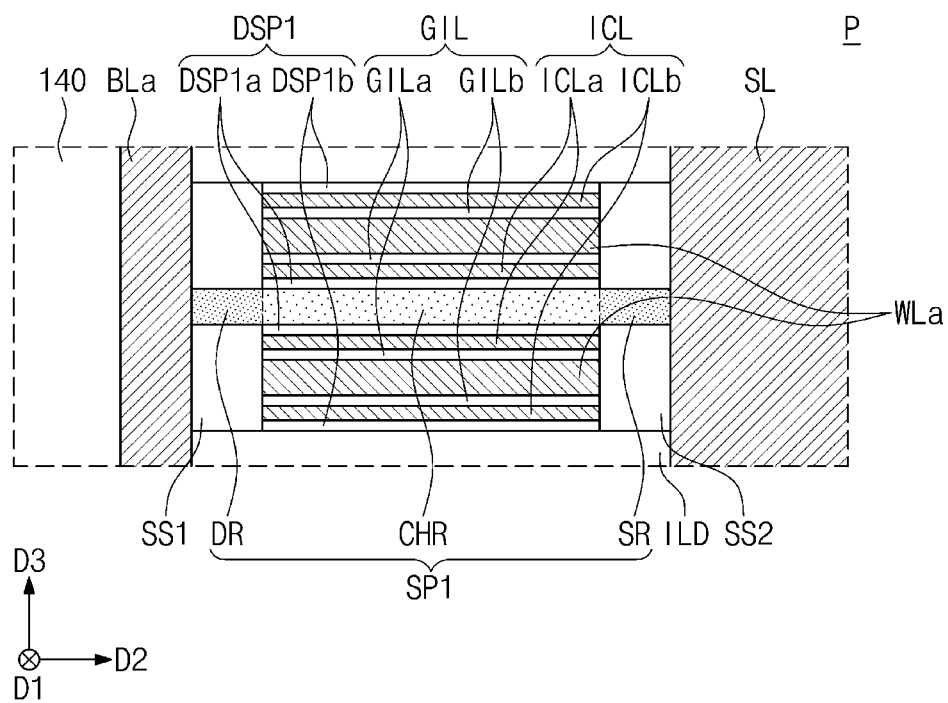
Figure 5:
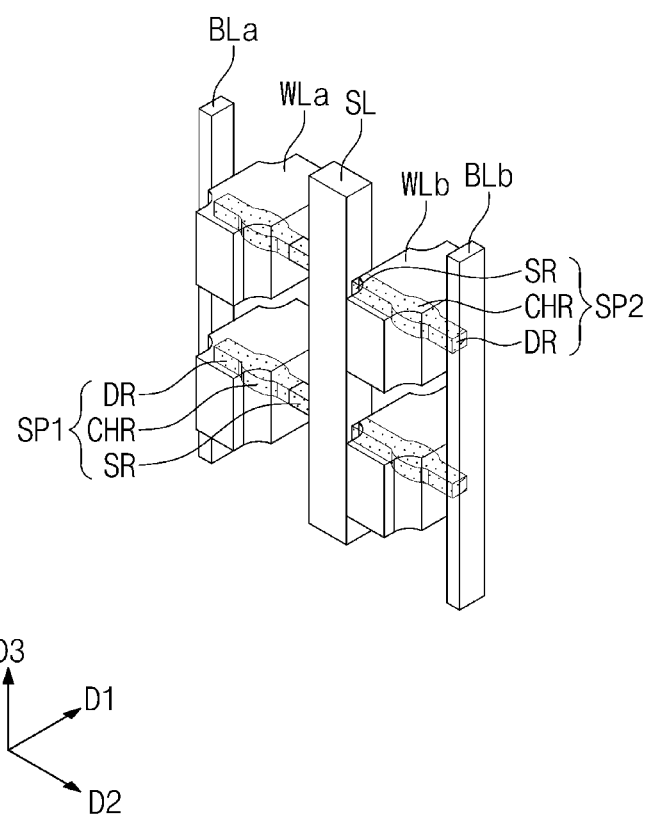
FIG. 5 is a perspective view illustrating a semiconductor memory device according to an embodiment of the inventive concept.

FIG. 2 is a plan view illustrating a semiconductor memory device according to an embodiment of the inventive concept. FIG. 3A is a sectional view, which is taken along lines A-A' and B-B' of FIG. 2 to illustrate a semiconductor memory device according to an embodiment of the inventive concept. FIG. 3B is a sectional view, which is taken along lines C-C' and D-D' of FIG. 2 to illustrate a semiconductor memory device according to an embodiment of the inventive concept. FIGS. 4A and 4B are enlarged sectional views illustrating a portion 'P' of FIG. 3A according to example embodiments. FIG. 5 is a perspective view illustrating a semiconductor memory device according to an embodiment of the inventive concept.

Referring to FIGS. 2, 3A, 3B, and 5, first and second stacks ST1 and ST2 may be disposed on a substrate 100. The first and second stacks ST1 and ST2 may be extended in a first direction D1 and may be spaced apart from each other in a second direction D2 crossing or perpendicular to the first direction D1. Here, the first and second directions D1 and D2 may be parallel to a top surface of the substrate 100. A pattern, layer or line described as extending "lengthwise" in a particular direction has a length in the particular direction and a width perpendicular to that direction, where the length is greater than the width.

The substrate 100 may be formed of or include at least one of a semiconductor material (e.g., silicon), an insulating material (e.g., glass), or a semiconductor or conductor material covered with an insulating material.

The first stack ST1 may include interlayer insulating patterns ILD and first word lines WLa, which are alternately stacked in a third direction D3 perpendicular to the top surface of the substrate 100. The second stack ST2 may include the interlayer insulating patterns ILD and second word lines WLb, which are alternately stacked in the third direction D3. An upper insulating layer TIL may cover the uppermost ones of the first and second word lines WLa and WLb.

Each of the first and second word lines WLa and WLb may include first portions, which have a first width in the second direction D2, and second portions, which have a second width greater than the first width. The second width of the second portions may range from about 90 nm to about 100 nm. Here, each of the first portions of the first and second word lines WLa and WLb may be disposed between first and second insulating isolation patterns STI1 and STI2, which are adjacent to each other in the second direction, and each of the second portions of the first and second word lines WLa and WLb may be disposed between first spacer insulating patterns SS1 and second spacer insulating patterns SS2, which are adjacent to each other in the second direction.

The first and second word lines WLa and WLb may be formed of or include at least one of doped semiconductor materials (e.g., doped silicon, doped germanium, and so forth), conductive metal nitrides (e.g., titanium nitride, tantalum nitride, and so forth), metallic materials (e.g., tungsten, titanium, tantalum, and so forth), or metal-semiconductor compounds (e.g., tungsten silicide, cobalt silicide, titanium silicide, and so forth).

First semiconductor patterns SP1 may be disposed on the substrate 100 to be spaced apart from each other in the first and third directions D1 and D3. The first semiconductor patterns SP1 may have a long axis which crosses the first word lines WLa and is extended in the second direction D2 parallel to the top surface of the substrate 100. Each of the first word lines WLa may be extended in the first direction D1 to surround the first semiconductor patterns SP1, which are located at the same level (hereinafter, the level may refer to as a vertical level) from the substrate 100. The first semiconductor patterns SP1 may penetrate the second portions of the first word lines WLa, respectively, in the second direction D2. For example, the first word lines WLa may fully surround the channel regions of the first semiconductor patterns SP1 or may have a gate-all-around structure.

Second semiconductor patterns SP2 may be disposed on the substrate 100 to be spaced apart from each other in the first and third directions D1 and D3 and may be spaced apart from the first semiconductor patterns SP1 in the second direction D2. The second semiconductor patterns SP2 may be located at the same levels as the first semiconductor patterns SP1. The second semiconductor patterns SP2 may have a long axis which crosses the second word lines WLb and is extended in the second direction D2 parallel to the top surface of the substrate 100. Each of the second word lines WLb may be extended in the first direction D1 to surround the second semiconductor patterns SP2, which are located at the same level from the substrate 100. The second semiconductor patterns SP2 may penetrate the second portions of the second word lines WLb, respectively, in the second direction D2. The second word lines WLb may fully surround the channel regions of the second semiconductor patterns SP2 or may have the gate-all-around structure.

The first and second semiconductor patterns SP1 and SP2 may be formed of or include a polycrystalline semiconductor material. For example, the first and second semiconductor patterns SP1 and SP2 may be formed of or include silicon (Si), germanium (Ge), or silicon-germanium (SiGe). In an embodiment, the first and second semiconductor patterns SP1 and SP2 may be formed of poly silicon. Alternatively, the first and second semiconductor patterns SP1 and SP2 may be formed of or include an oxide semiconductor material (e.g., indium gallium zinc oxide (IGZO), indium tungsten oxide (IWO), zinc oxide (ZnO), indium tin zinc oxide (ITZO), or barium stannate (BaSnO) or a two-dimensional material (e.g., molybdenum disulfide ($MoS_2$) or tungsten diselenide ($WSe_2$).

Each of the first and second semiconductor patterns SP1 and SP2 may have a thickness of about 3 nm to about 15 nm, in the third direction D3. Each of the first and second semiconductor patterns SP1 and SP2 may have about a length of about 120 nm to about 150 nm, in the second direction D2.

Referring to FIG. 4A, each of the first and second semiconductor patterns SP1 and SP2 may include source/drain regions SR and DR, which are spaced apart from each other in the second direction D2, and a channel region CHR, which is provided between the source/drain regions SR and DR. The source/drain regions SR and DR of each of the first and second semiconductor patterns SP1 and SP2 may be doped with impurities.

Referring back to FIGS. 2, 3A, and 3B, the first and second semiconductor patterns SP1 and SP2 may be disposed to be symmetric to each other, with the source lines SL interposed therebetween. The source regions SR of the first and second semiconductor patterns SP1 and SP2, which are adjacent to each other in the second direction D2, may be connected in common to a corresponding one of the source lines SL.

The first insulating isolation patterns STI1 may be respectively disposed between the drain regions of the first semiconductor patterns SP1 adjacent to each other in the first direction D1 and between the drain regions of the second semiconductor patterns SP2 adjacent to each other in the first direction D1.

The second insulating isolation patterns STI2 may be respectively disposed between the source regions of the first semiconductor patterns SP1 adjacent to each other in the first direction D1 and between the source regions of the second semiconductor patterns SP2 adjacent to each other in the first direction D1.

The first and second insulating isolation patterns STI1 and STI2 may be extended in the third direction D3, on the substrate 100. The first and second insulating isolation patterns STI1 and STI2 may be formed of or include at least one of silicon oxide or silicon oxynitride.

First and second data storage patterns DSP1 and DSP2 may be interposed between the channel regions of the first and second semiconductor patterns SP1 and SP2 and the first and second word lines WLa and WLb and between the interlayer insulating patterns ILD and the first and second word lines WLa and WLb.

The first and second data storage patterns DSP1 and DSP2 may be formed of or include a ferroelectric material, which has a polarization property when an electric field is applied thereto. The ferroelectric material may be formed of a dielectric material containing hafnium. In an embodiment, the ferroelectric material may be formed of hafnium oxide ($HfO_2$), HfSiO2 (Si-doped $HfO_2$), $HfAlO_2$ (Al-doped $HfO_2$), HfSiON, HfZnO, $HfZrO_2$, $ZrO_2$, $ZrSiO_2$, $HfZrSiO_2$, ZrSiON, LaAlO, $HfDyO_2$, or $HfScO_2$.

In detail, referring to FIG. 4A, each of the first data storage patterns DSP1 may include an inner portion DSP1a adjacent to the first semiconductor pattern SP1 and an outer portion DSP1b adjacent to the interlayer insulating patterns ILD, and the inner portion DSP1a may have a cylinder or tube shaped structure, in which both ends are opened.

The inner portion DSP1a of the first data storage pattern DSP1 may be provided to surround the channel region CHR of the first semiconductor pattern SP1. The outer portion DSP1b of the first data storage pattern DSP1 may be in contact with the interlayer insulating patterns ILD and may be extended along top and bottom surfaces of the first word line WL1 and in the first direction D1. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The second data storage patterns DSP2 may be provided to have substantially the same features as the first data storage pattern DSP1. For example, the second data storage pattern DSP2 may be provided to surround the channel region CHR of the second semiconductor pattern SP2.

Furthermore, referring to FIG. 4A, gate insulating layers GIL may be interposed between the first data storage patterns DSP1 and the first word lines WLa and between the second data storage patterns DSP2 and the second word lines WL2. The gate insulating layers GIL may include an inner portion GILa, which is provided to surround the first semiconductor pattern SP1, and an outer portion GILb, which is provided adjacent to the interlayer insulating patterns ILD. The inner portion GILa of the gate insulating layers GIL may have a cylinder or tube shaped structure, in which both ends are opened. The inner portion GILa of the gate insulating layer GIL may be provided to surround the first or second data storage pattern DSP1 or DSP2. The outer portion GILb of the gate insulating layer GIL may be extended along the top and bottom surfaces of the first word line WLa or in the first direction D1.

The gate insulating layers GIL may be formed of or include at least one of high-k dielectric materials, silicon oxide, silicon nitride, or silicon oxynitride. The high-k dielectric materials may include hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

Referring to FIG. 4B, an intermediate conductive pattern ICL may be interposed between the first data storage patterns DSP1 and the gate insulating layers GIL.

The intermediate conductive pattern ICL may include an inner portion ICLa adjacent to the first semiconductor pattern SP1 and an outer portion ICLb adjacent to the interlayer insulating patterns ILD, and the inner portion ICLa may surround the inner portion DSP1a of the first data storage pattern DSP1. The intermediate conductive pattern ICL may be formed of or include at least one of doped semiconductor materials (e.g., doped silicon, doped germanium, and so forth), conductive metal nitrides (e.g., titanium nitride, tantalum nitride, and so forth), metallic materials (e.g., tungsten, titanium, tantalum, and so forth), or metal-semiconductor compounds (e.g., tungsten silicide, cobalt silicide, titanium silicide, and so forth).

Referring back to FIGS. 2, 3A, and 3B, in each of the first and second stacks ST1 and ST2, the first spacer insulating patterns SS1 and the second spacer insulating patterns SS2 may be disposed between vertically adjacent ones of the interlayer insulating patterns ILD. The first spacer insulating patterns SS1 may be provided to surround the drain regions of the first and second semiconductor patterns SP1 and SP2. The second spacer insulating patterns SS2 may be provided to surround the source regions of the first and second semiconductor patterns SP1 and SP2. The first and second spacer insulating patterns SS1 and SS2 may be formed of for example, silicon nitride or silicon oxynitride.

First and second bit lines BLa and BLb may be extended in the third direction D3 that is perpendicular to the top surface of the substrate 100. The first and second bit lines BLa and BLb may cross the first and second word lines WLa and WLb. The first bit lines BLa may be spaced apart from each other in the first direction D1, and the first insulating isolation patterns STI1 may be respectively disposed between the first bit lines BLa, which are adjacent to each other in the first direction D1.

Each of the first bit lines BLa may be in contact with first side surfaces of the first semiconductor patterns SP1, which are spaced apart from each other in the third direction D3. For example, the first bit lines BLa may be connected to the drain regions of the first semiconductor patterns SP1.

The second bit lines BLb may be spaced apart from the first bit lines BLa in the second direction D2 and may be spaced apart from each other in the first direction D1. The first insulating isolation patterns STI1 may be respectively disposed between the second bit lines BLb, which are adjacent to each other in the first direction D1.

Each of the second bit lines BLb may be in contact with first side surfaces of the second semiconductor patterns SP2, which are spaced apart from each other in the third direction D3. For example, the second bit lines BLb may be connected to the drain regions of the second semiconductor patterns SP2.

The source lines SL may be provided between the first and second semiconductor patterns SP1 and SP2, which are adjacent to each other in the second direction D2 and may be extended in the third direction D3. The source lines SL may be spaced apart from each other in the first direction D1, on the substrate 100. The source lines SL may be provided to cross the first and second word lines WLa and WLb.

Bit line insulating isolation patterns 140 may be provided on the substrate 100 to extend in the third direction D3 and to cover side surfaces of the first and second bit lines BLa and BLb. In addition, the bit line insulating isolation patterns 140 may be extended in the first direction D1.

Source line insulating isolation patterns 150 may be disposed between the source lines SL, which are adjacent to each other in the first direction D1. The source line insulating isolation patterns 150 may be provided on the substrate 100 to extend in the third direction D3 and may be disposed between the second insulating isolation patterns STI2, which are adjacent to each other in the second direction D2.

Figure 6B:
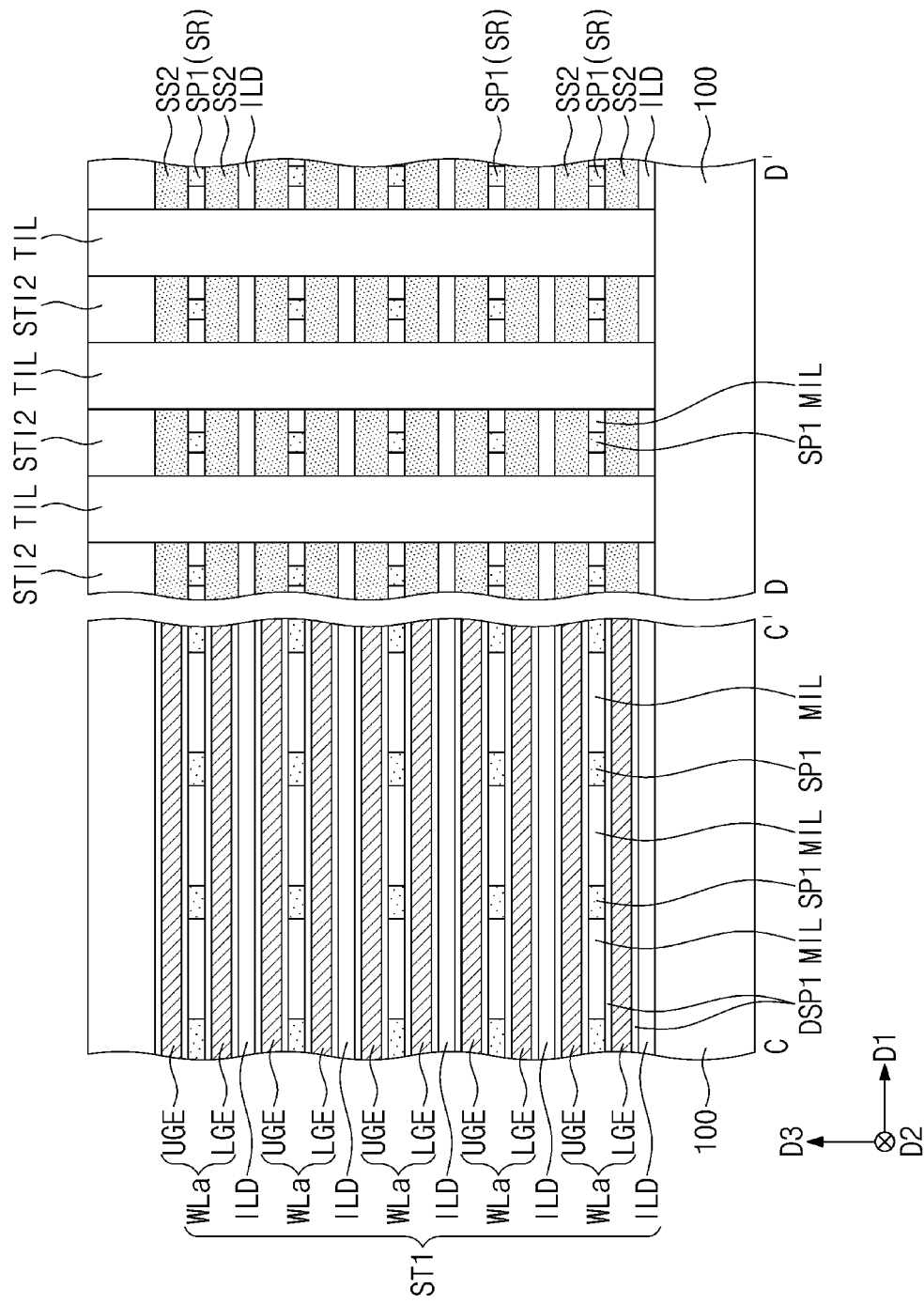
FIG. 6B is a sectional view, which is taken along the lines C-C' and D-D' of FIG. 2 to illustrate a semiconductor memory device according to an embodiment of the inventive concept.

FIG. 6A is a sectional view, which is taken along the lines A-A' and B-B' of FIG. 2 to illustrate a semiconductor memory device according to an embodiment of the inventive concept. FIG. 6B is a sectional view, which is taken along the lines C-C' and D-D' of FIG. 2 to illustrate a semiconductor memory device according to an embodiment of the inventive concept. For concise description, the same element as the afore-described semiconductor memory device may be identified by the same reference number without repeating an overlapping description thereof.

Referring to FIGS. 6A and 6B, each of the first word lines WLa may be composed of a pair of lower and upper gate electrodes LGE and UGE. The lower and upper gate electrodes LGE and UGE may be extended in the first direction D1. The lower gate electrode LGE may be provided to cross a bottom surface of the first semiconductor pattern SP1, and the upper gate electrode UGE may be provided to cross a top surface of the first semiconductor pattern SP1. Similarly, each of the second word lines WLb may be composed of a pair of the lower and upper gate electrodes LGE and UGE.

An intermediate insulating pattern MIL may be interposed between each pair of the lower and upper gate electrodes LGE and UGE. The intermediate insulating pattern MTh may be located at the same level as the first and second semiconductor patterns SP1 and SP2. The intermediate insulating pattern MTh may be formed of or include the same insulating material (e.g., silicon oxide) as the interlayer insulating patterns ILD.

The first data storage pattern DSP1 may be extended along the lower and upper gate electrodes LGE and UGE of each of the first word lines WLa and in the first direction D1. The first data storage pattern DSP1 may be interposed between the lower gate electrode LGE and the bottom surface of the first semiconductor pattern SP1 and between the upper gate electrode UGE and the top surface of the first semiconductor pattern SP1. Similarly, the second data storage pattern DSP2 may be configured to have the same technical feature as the first data storage pattern DSP1.

Figure 7:
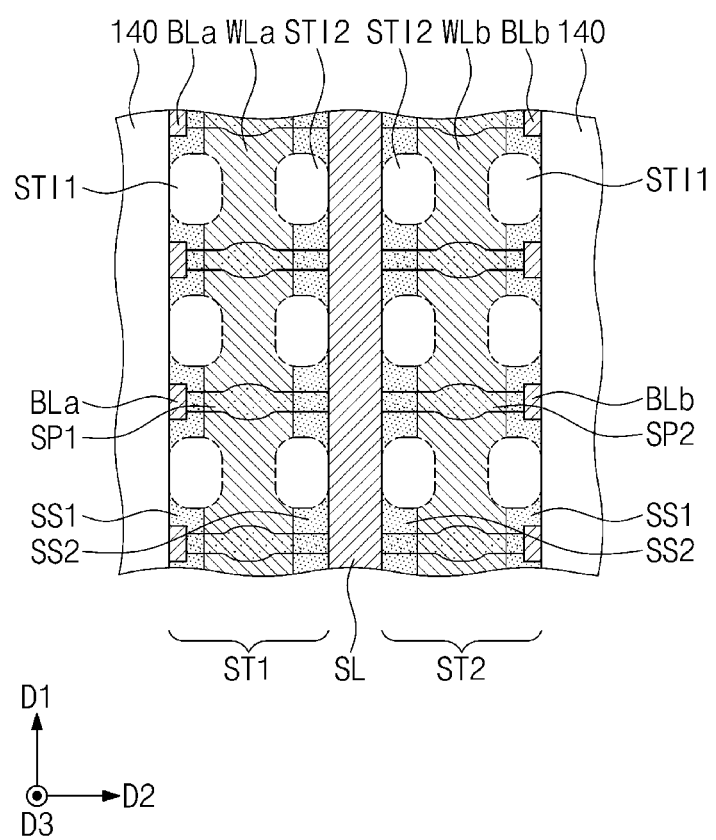
FIGS. 7 and 8 are diagrams, each of which illustrates a semiconductor memory device according to an embodiment of the inventive concept.
Figure 8:
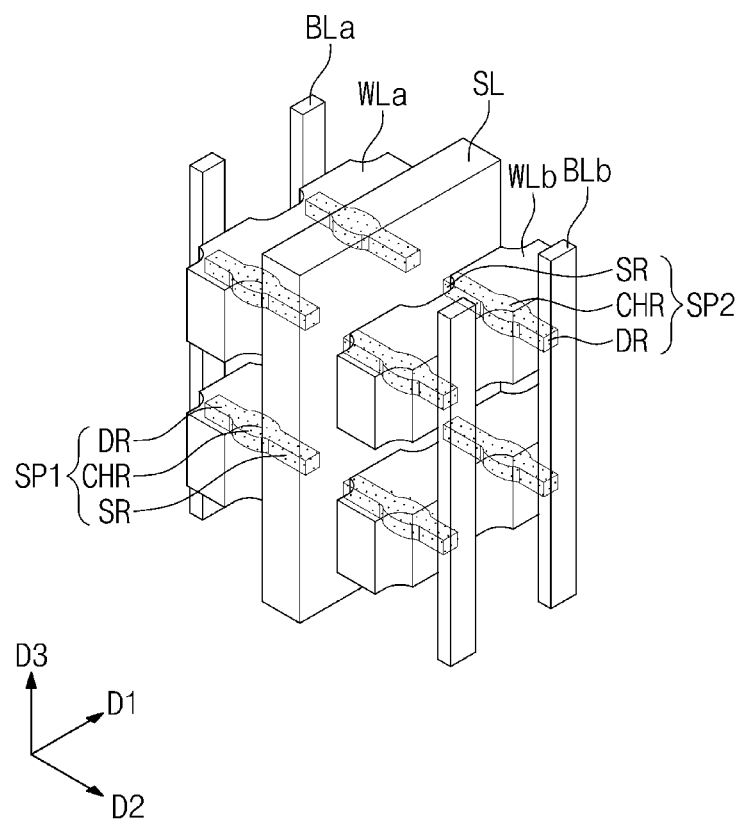

FIGS. 7 and 8 are diagrams, each of which illustrates a semiconductor memory device according to an embodiment of the inventive concept. For concise description, the same element as the afore-described semiconductor memory device may be identified by the same reference number without repeating an overlapping description thereof.

Referring to FIGS. 7 and 8, the source line SL may be disposed between the first and second semiconductor patterns SP1 and SP2 adjacent to each other in the second direction D2. Here, the source line SL may be provided on the substrate 100 and may be extended in the first and third directions D1 and D3. For example, the source line SL may be extended from a region between the first and second semiconductor patterns SP1 and SP2 to a region between the first and second insulating isolation patterns STI1 and STI2 in the first direction D1. The source line SL may be connected in common to the first semiconductor patterns SP1, which are arranged in the first and third direction D1 and D3, and the second semiconductor patterns SP2, which are arranged in the first and third direction D1 and D3.

Figure 9:
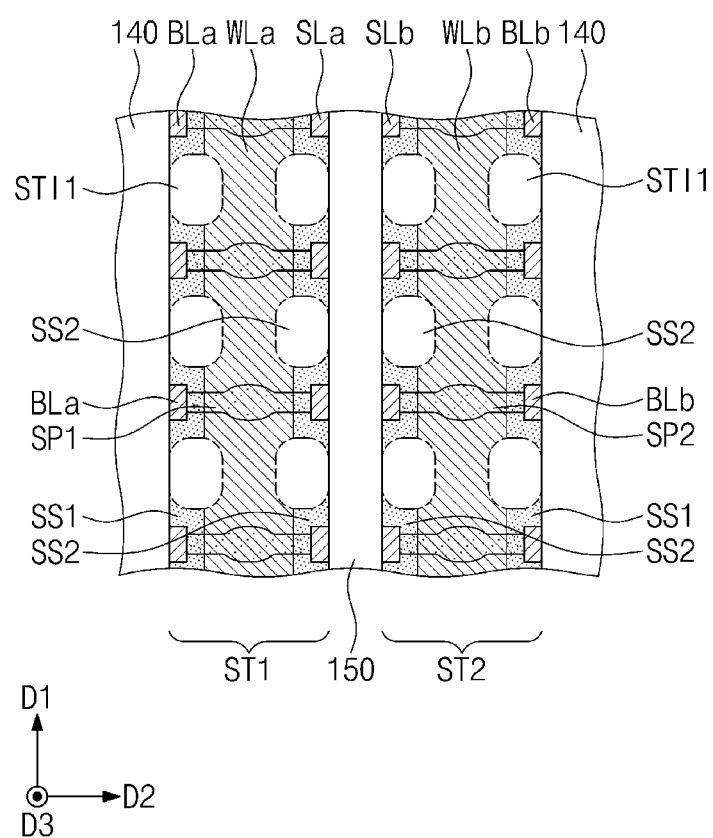
FIGS. 9 and 10 are diagrams, each of which illustrates a semiconductor memory device according to an embodiment of the inventive concept.
Figure 10:
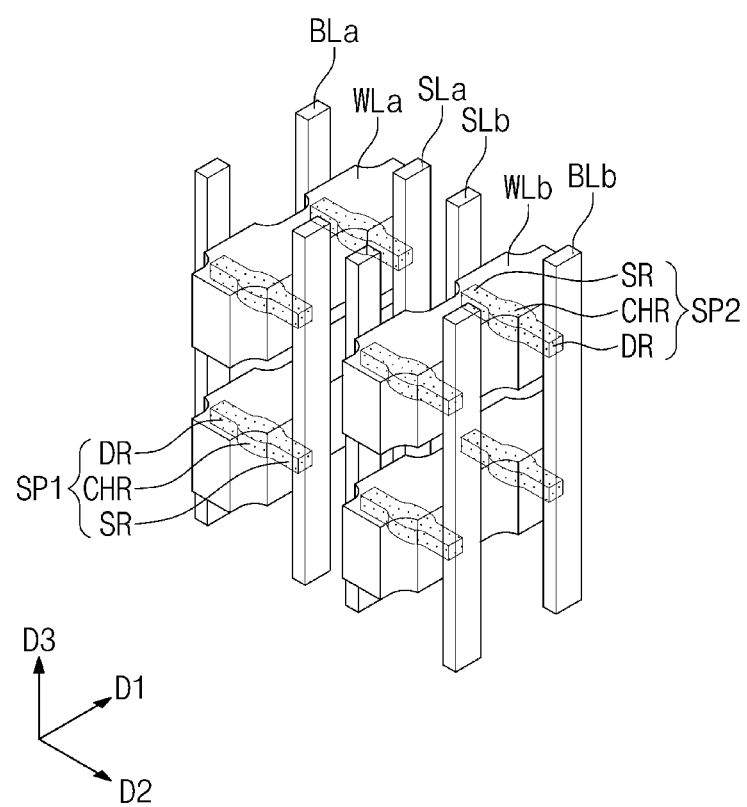

FIGS. 9 and 10 are diagrams, each of which illustrates a semiconductor memory device according to an embodiment of the inventive concept. For concise description, the same element as the afore-described semiconductor memory device may be identified by the same reference number without repeating an overlapping description thereof.

Referring to FIGS. 9 and 10, the first semiconductor patterns SP1 may be respectively provided between first source lines SLa and the first bit lines BLa, and the second semiconductor patterns SP2 may be respectively provided between second source lines SLb and the second bit lines BLb. Each of the first source lines SLa may be connected to the source regions of the first semiconductor patterns SP1, which are spaced apart from each other in the third direction D3. Each of the second source lines SLb may be connected to the source regions of the second semiconductor patterns SP2, which are spaced apart from each other in the third direction D3.

The first and second source lines SLa and SLb may be spaced apart from each other in the second direction D2, and the source line insulating isolation pattern 150 may be provided therebetween. The first source lines SLa may be extended in the third direction D3 and may be spaced apart from each other in the first direction D1 by the second insulating isolation patterns STI2. Similarly, the second source lines SLb may be extended in the third direction D3 and may be spaced apart from each other in the first direction D1 by the second insulating isolation patterns STI2.

FIGS. 11A to 19A are plan views illustrating a method of fabricating a semiconductor memory device according to an embodiment of the inventive concept. FIGS. 11B to 19B are sectional views, which are taken along lines A-A' and B-B' of FIGS. 11A to 19A to illustrate a method of fabricating a semiconductor memory device according to an embodiment of the inventive concept. FIGS. 11C to 17C are sectional views, which are taken along line C-C' of FIGS. 11A to 17A to illustrate a method of fabricating a semiconductor memory device according to an embodiment of the inventive concept.

Figure 11A:
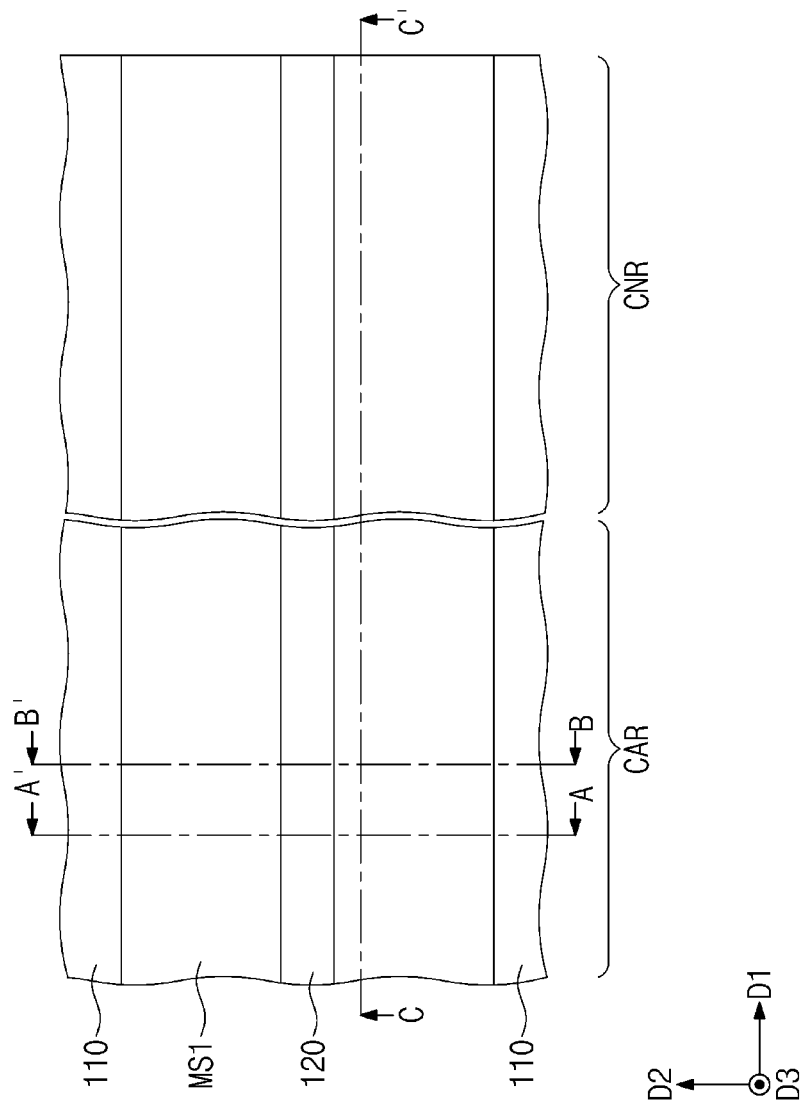
Figure 11B:
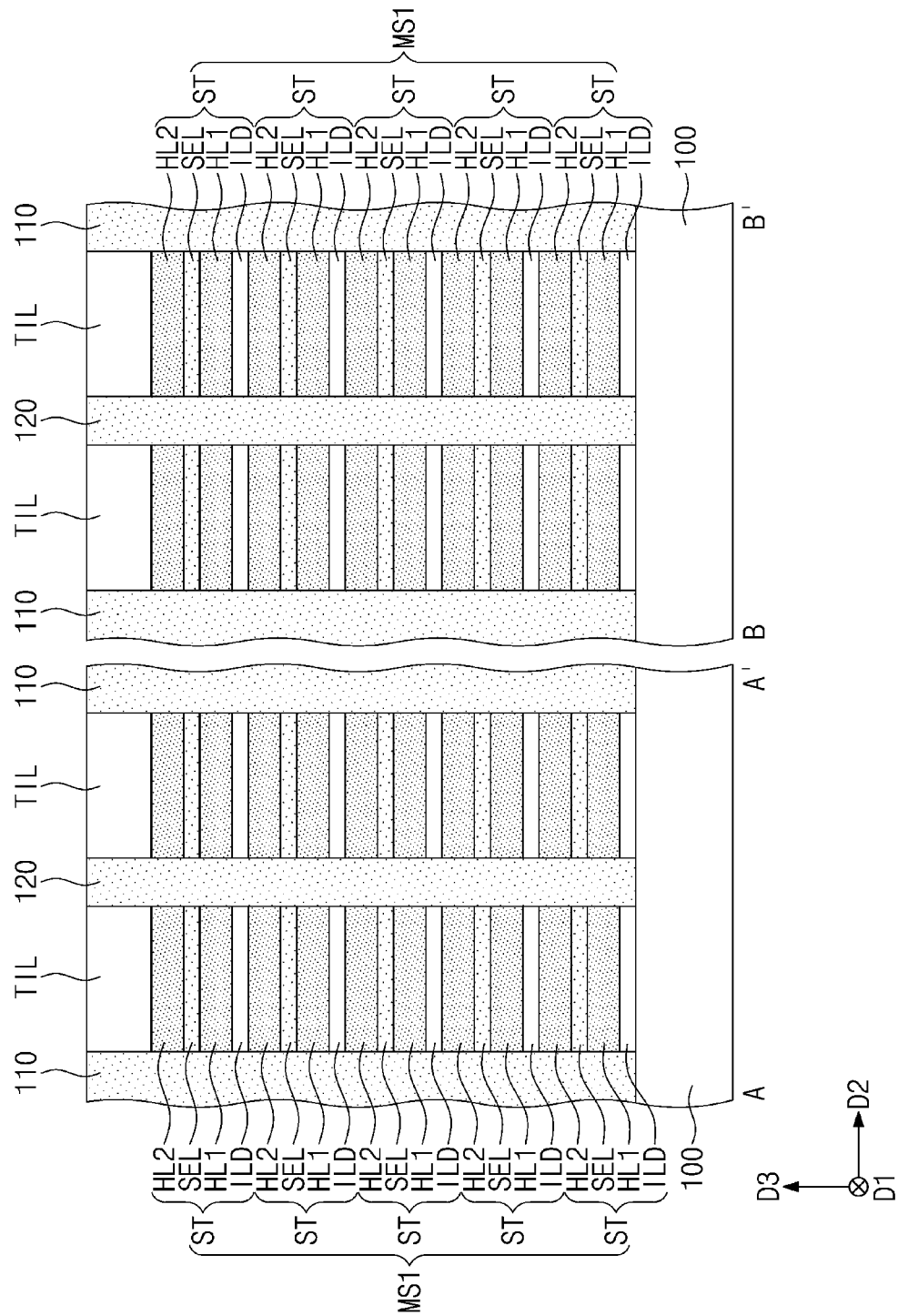
Figure 11C:
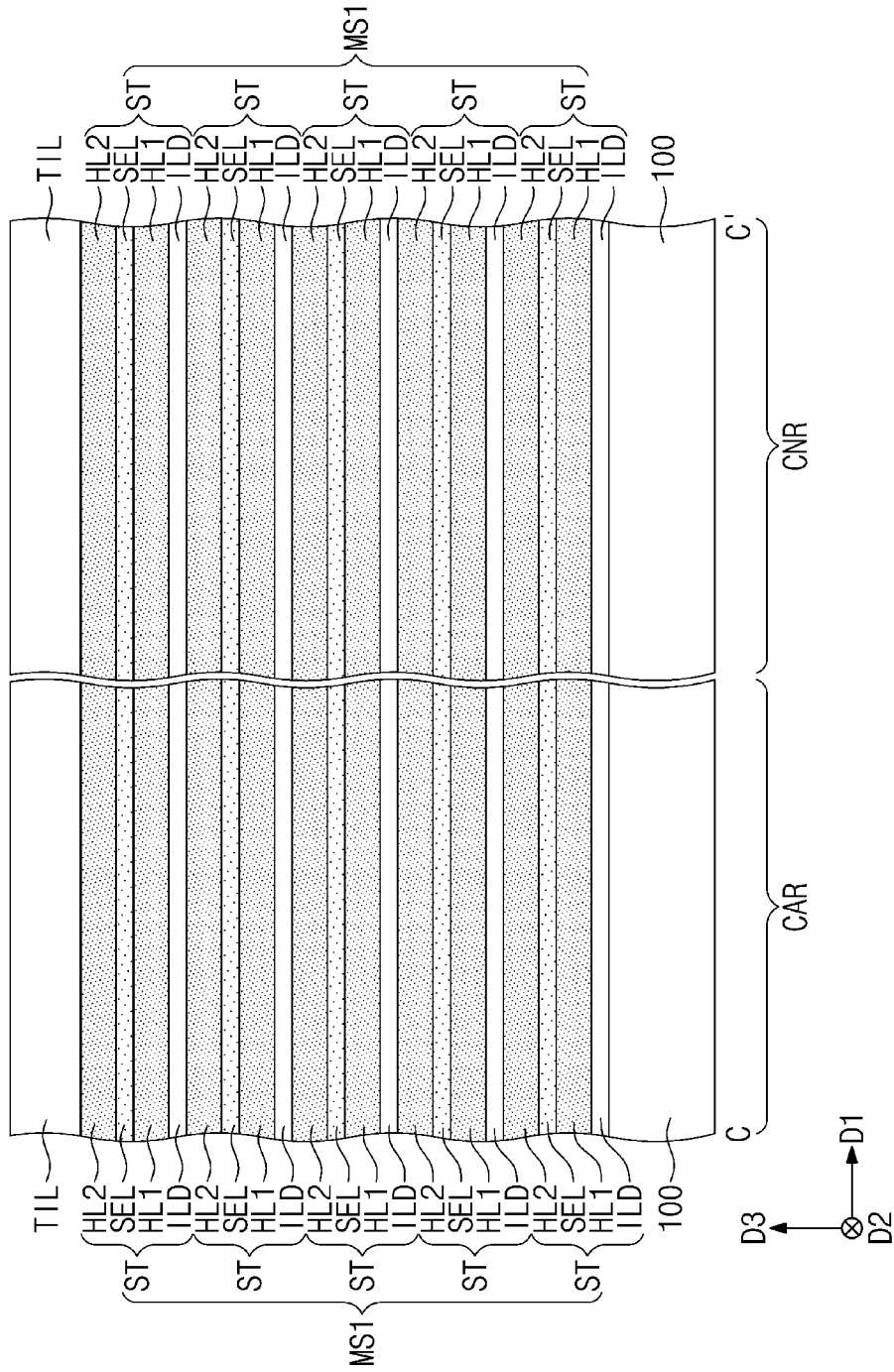

Referring to FIGS. 11A, 11B, and 11C, the substrate 100 may be provided, and in an embodiment, the substrate 100 may include a cell array region CAR and a connection region CNR which are adjacent to each other. The substrate 100 may be formed of or include at least one of a semiconductor material (e.g., silicon), an insulating material (e.g., glass), or a semiconductor or conductor material covered with an insulating material.

A first mold structure MS1 may be formed on the substrate 100. The first mold structure MS1 may include a plurality of stacks ST, which are vertically stacked on the substrate 100. Each of the stacks ST may include an interlayer insulating layer ILD, a first sacrificial layer HL1, a semiconductor layer SEL, and a second sacrificial layer HL2, which are sequentially stacked on the substrate 100.

The first and second sacrificial layers HL1 and HL2 may be formed of or include a material that has an etch selectivity with respect to the interlayer insulating layer ILD and the semiconductor layer SEL. For example, the first and second sacrificial layers HL1 and HL2 may be formed of silicon nitride, and the interlayer insulating layers ILD may be formed of silicon oxide. Each of the first and second sacrificial layers HL1 and HL2 may have a thickness that is greater than a thickness of the interlayer insulating layer ILD.

The semiconductor layer SEL may be formed of or include a semiconductor material having a polycrystalline structure. The semiconductor layer SEL may be formed of or include at least one of silicon, germanium, silicon germanium, oxide semiconductor materials, and two-dimensional materials. As an example, the semiconductor layer SEL may be formed of poly silicon. A thickness of the semiconductor layer SEL may be smaller than a thickness of each of the first and second sacrificial layers HL1 and HL2 and the interlayer insulating layer ILD.

The interlayer insulating layer ILD, the first sacrificial layer HL1, the semiconductor layer SEL, and the second sacrificial layer HL2 of each stack ST may be formed by a chemical vapor deposition (CVD) method or an atomic layer deposition (ALD) method.

The upper insulating layer TIL may be formed on the first mold structure MS1 (in particular, the second sacrificial layer HL2 of the uppermost one of the stacks ST). The upper insulating layer TIL may be formed of or include an insulating material, which has an etch selectivity with respect to the first and second sacrificial layers HL1 and HL2 and the semiconductor layers SEL. For example, the upper insulating layer TIL may be a silicon oxide layer.

Thereafter, first and second insulating gapfill patterns 110 and 120 may be formed to penetrate the first mold structure MS1 in the third direction D3 and to extend in the first direction D1. The second insulating gapfill pattern 120 may be formed between a pair of the first insulating gapfill patterns 110. Due to the first and second insulating gapfill patterns 110 and 120, the first mold structure MS1 may have a line-shaped structure extending in the first direction D1.

The formation of the first and second insulating gapfill patterns 110 and 120 may include forming a mask pattern (not shown) having openings, which are extended in the first direction D1, anisotropically etching the first mold structure MS1 using the mask pattern as an etch mask to form first and second trenches, and filling the first and second trenches with an insulating material.

Figure 12A:
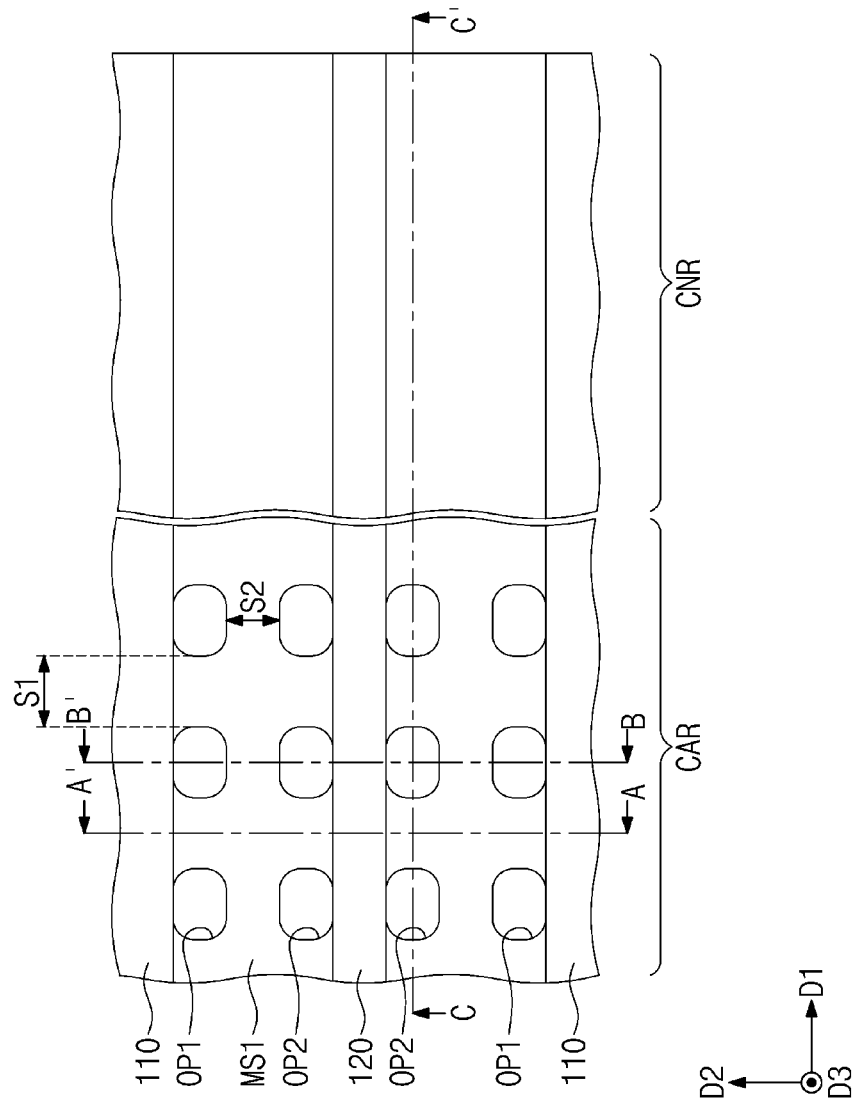
Figure 12B:
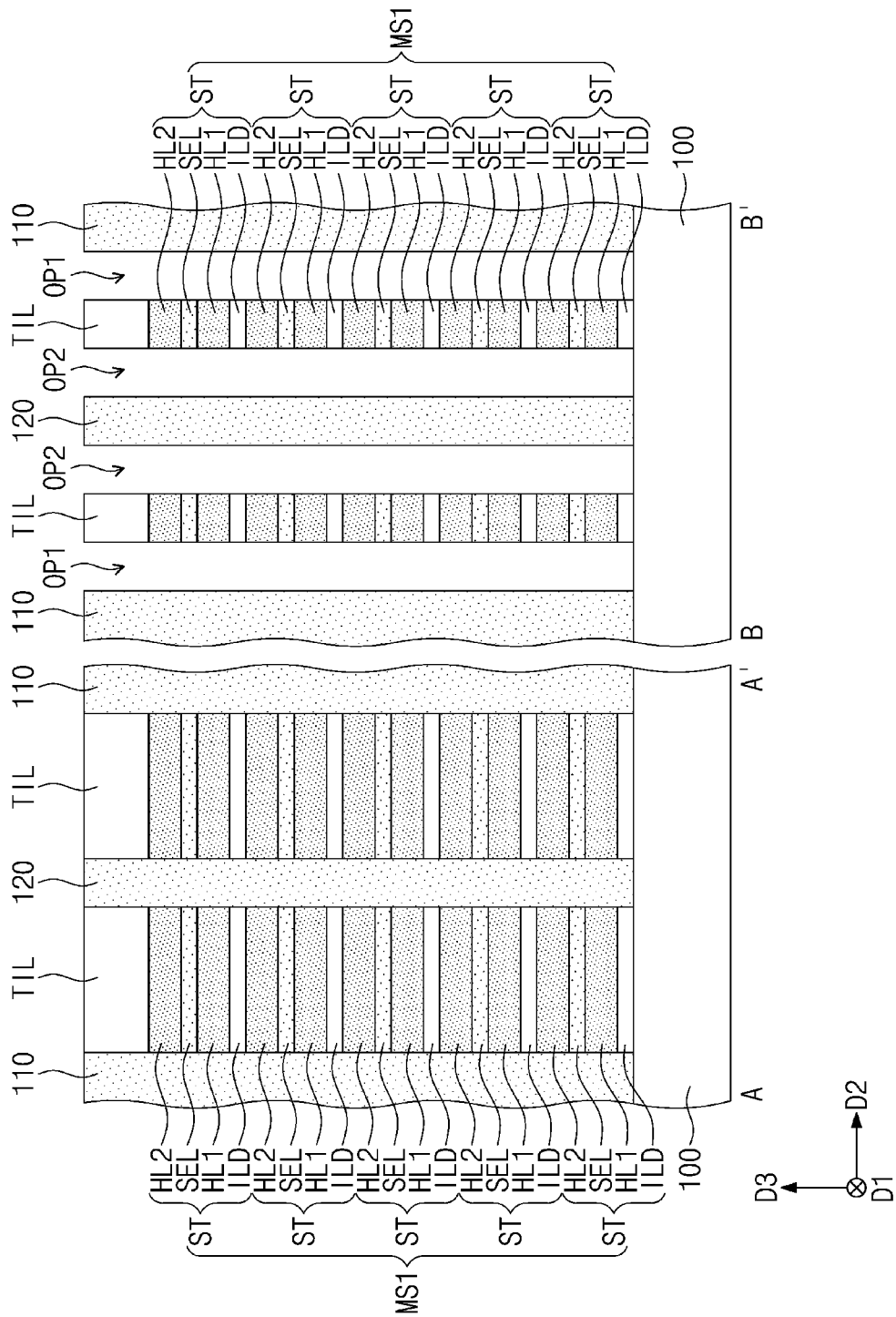
Figure 12C:
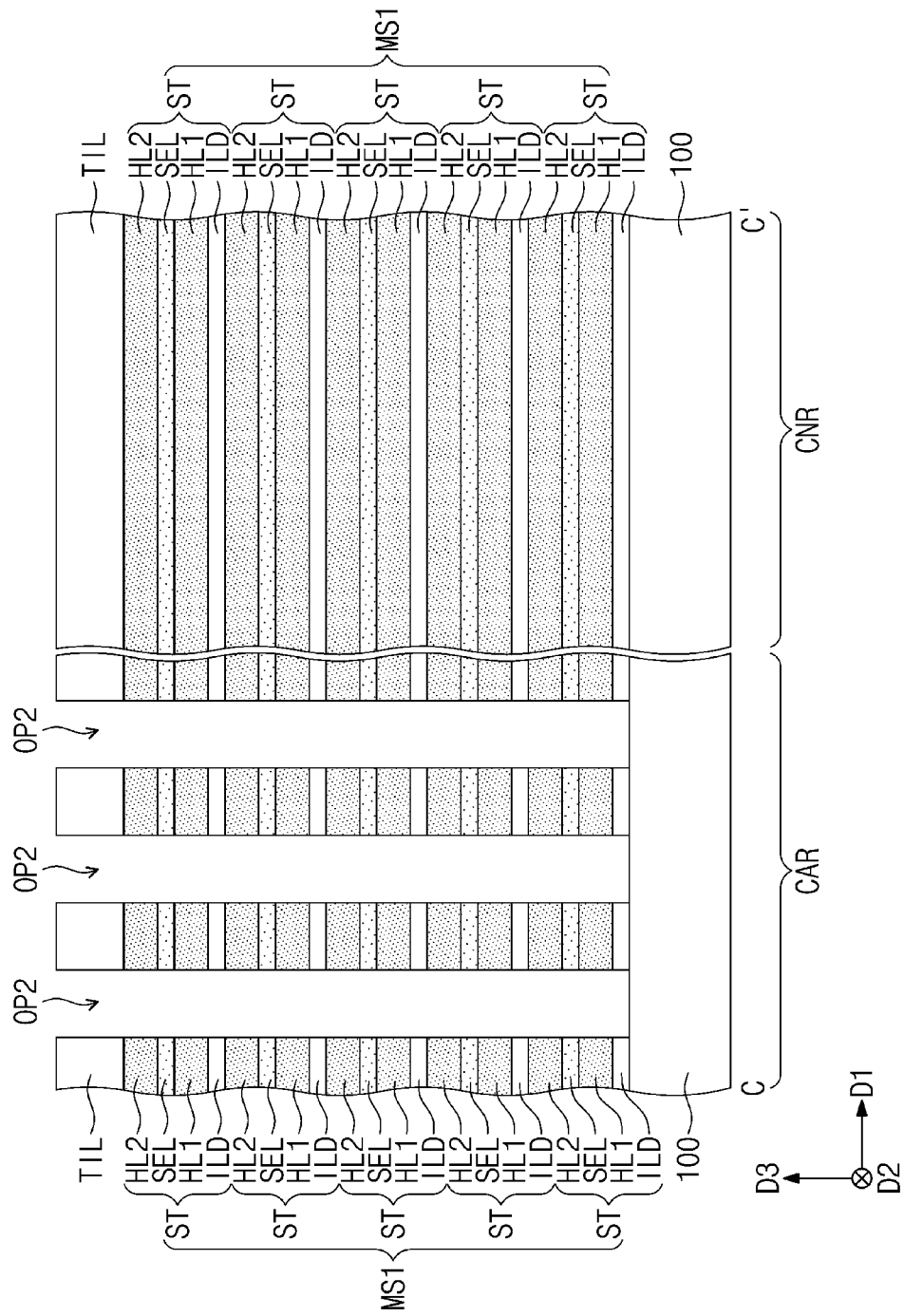

Referring to FIGS. 12A, 12B, and 12C, first and second openings OP1 and OP2, which expose the cell array region CAR of the substrate 100, may be formed by patterning the first mold structure MS1.

The formation of the first and second openings OP1 and OP2 may include forming a mask pattern (not shown), which has openings corresponding to the first and second openings OP1 and OP2, on the first mold structure MS1 and anisotropically etching the first mold structure MS1 using the mask pattern as an etch mask. The first and second openings OP1 and OP2 may be formed to expose the top surface of the substrate 100, and in the case where the anisotropic etching is performed in an over-etch manner, the top surface of the substrate 100 below the first and second openings OP1 and OP2 may be partially recessed.

The first openings OP1 may be formed to be spaced apart from each other in the first direction D1. The second openings OP2 may be formed to be spaced apart from each other in the first direction D1, and the second openings OP2 may be spaced apart from the first openings OP1 in the second direction D2. The first openings OP1 may be adjacent to the first insulating gapfill pattern 110, and the second openings OP2 may be adjacent to the second insulating gapfill pattern 120. The second insulating gapfill pattern 120 may be disposed between the second openings OP2, which are adjacent to each other in the second direction D2.

The first and second openings OP1 and OP2 may be spaced apart from each other by a first distance S1 in the first direction D1. The first openings OP1 may be spaced apart from the second openings OP2 by a second distance S2, which is smaller than the first distance S1, in the second direction D2.

Figure 13A:
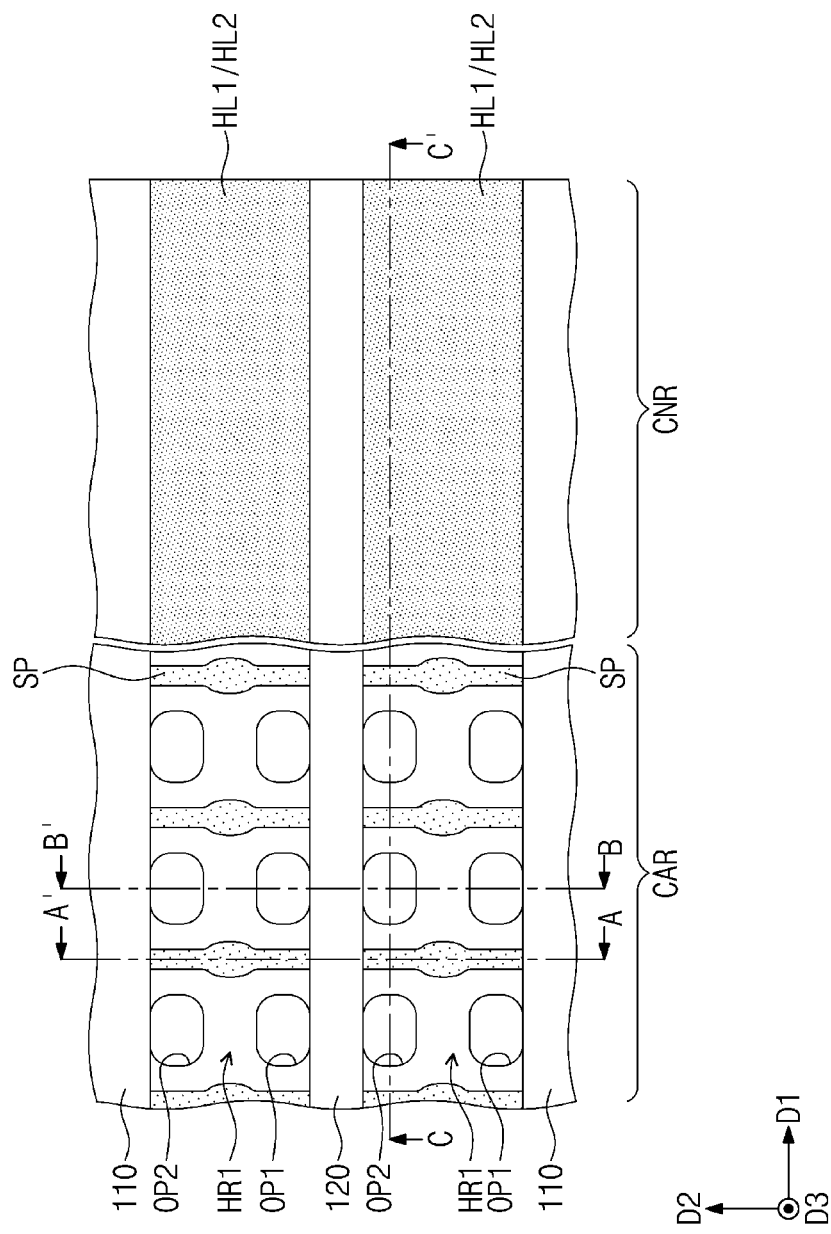
Figure 13B:
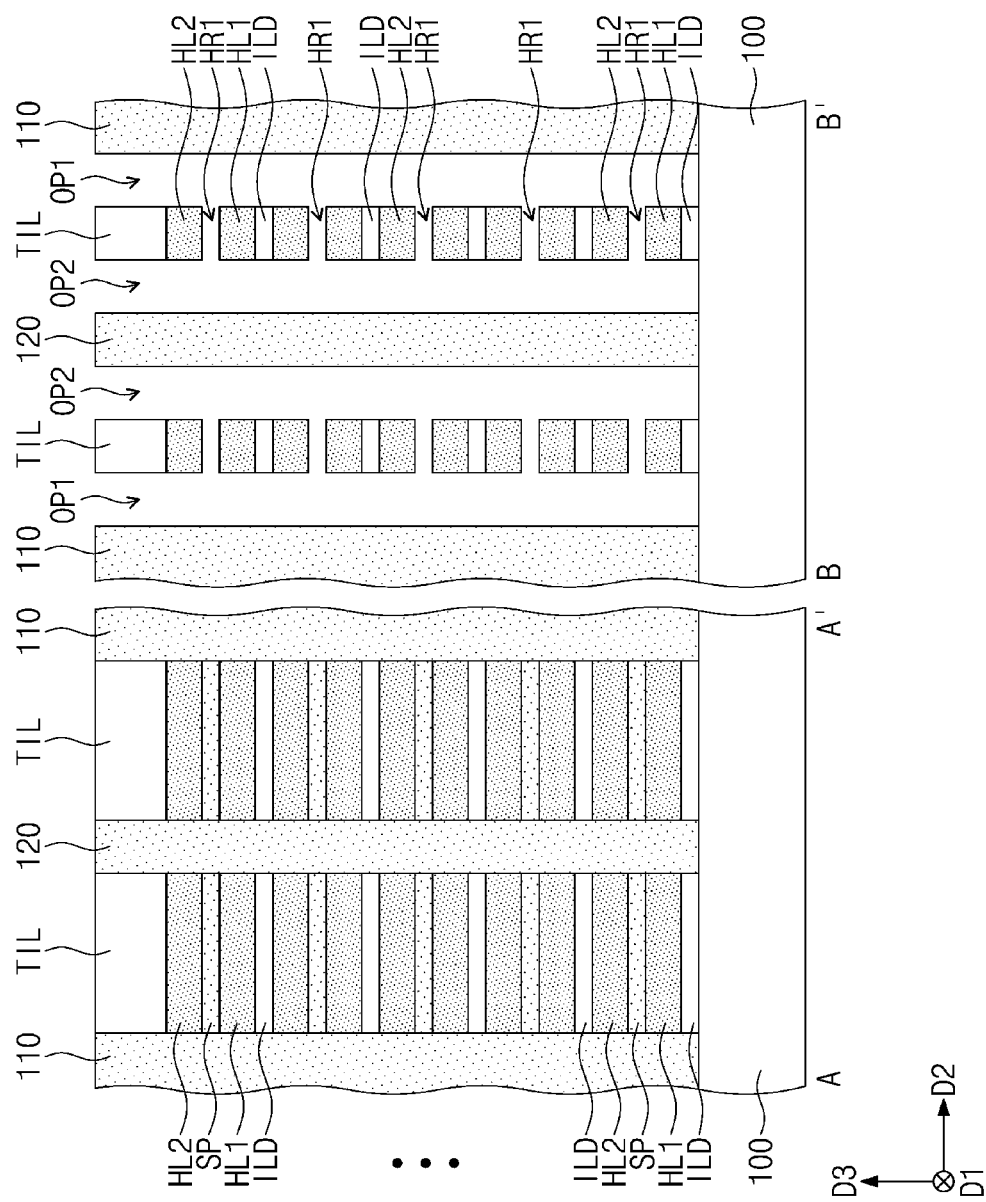
Figure 13C:
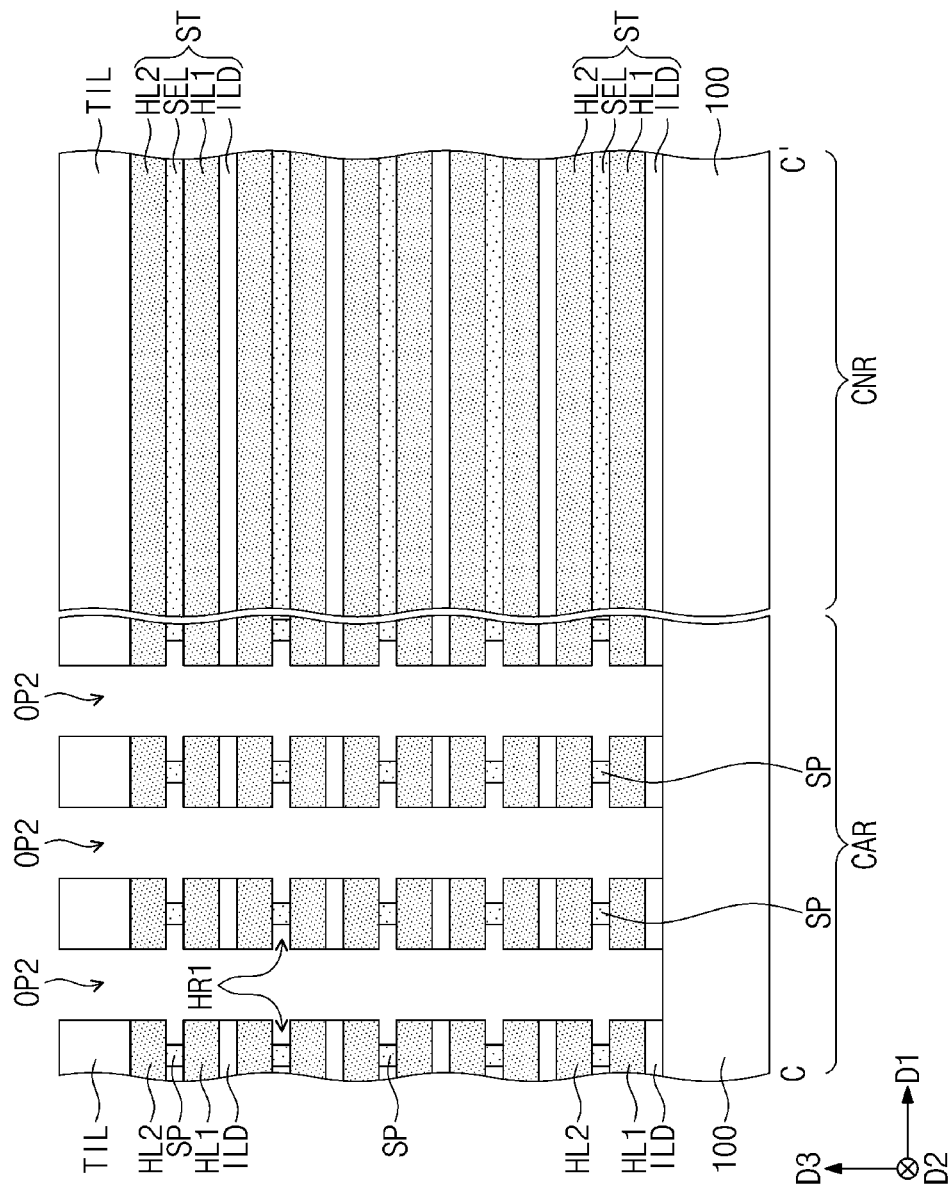

Referring to FIGS. 13A, 13B, and 13C, an isotropic etching process may be performed on side surfaces of the semiconductor layers SEL, which are exposed through the first and second openings OP1 and OP2. Accordingly, each semiconductor layer SEL may be divided into a plurality of semiconductor patterns SP, which are spaced apart from each other in the first direction D1, in the cell array region CAR, and may form remaining semiconductor patterns SEP in the connection region CNR. The remaining semiconductor patterns SEP may be located at the same level as the semiconductor patterns SP.

In detail, during the formation of the semiconductor patterns SP, the semiconductor layers SEL may be etched laterally (e.g., in the first and second directions D1 and D2) by an etchant supplied through the first and second openings OP1 and OP2. Here, since a distance between the first openings OP1 and a distance between the second openings OP2 are greater than a distance between the first and second openings OP1 and OP2, each semiconductor layer SEL may be divided into the semiconductor patterns SP, which are spaced apart from each other in the first direction D1. As a result of the isotropic etching process, a width of each of the semiconductor patterns SP in the first direction D1 may be greater at its center portion than at its sidewall portion.

As a result of the afore-described formation of the semiconductor patterns SP, first horizontal regions HR1 may be formed between the first and second sacrificial layers HL1 and HL2 to expose side surfaces of the semiconductor patterns SP. The first horizontal regions HR1 may correspond to empty regions, which are formed by etching the semiconductor layers SEL.

Figure 14A:
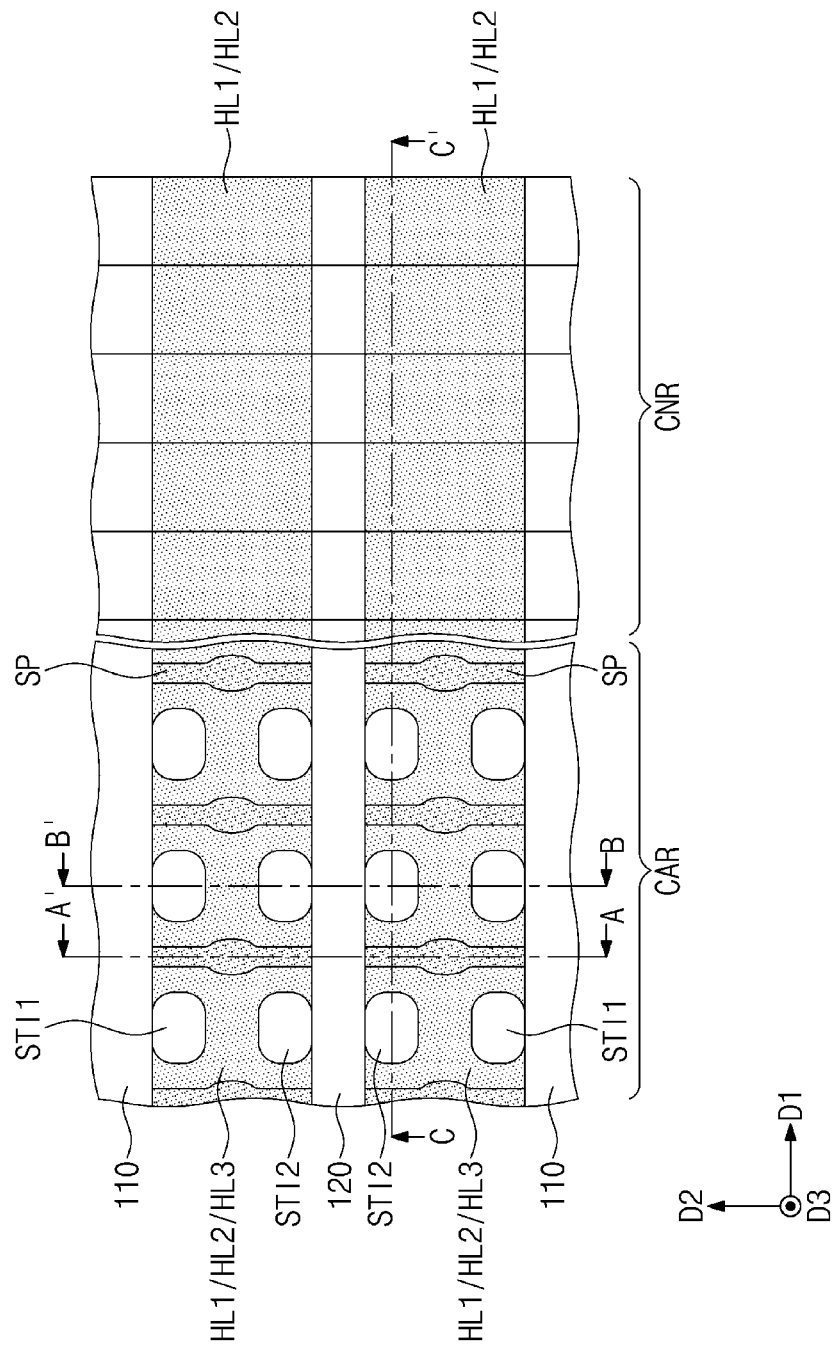
Figure 14B:
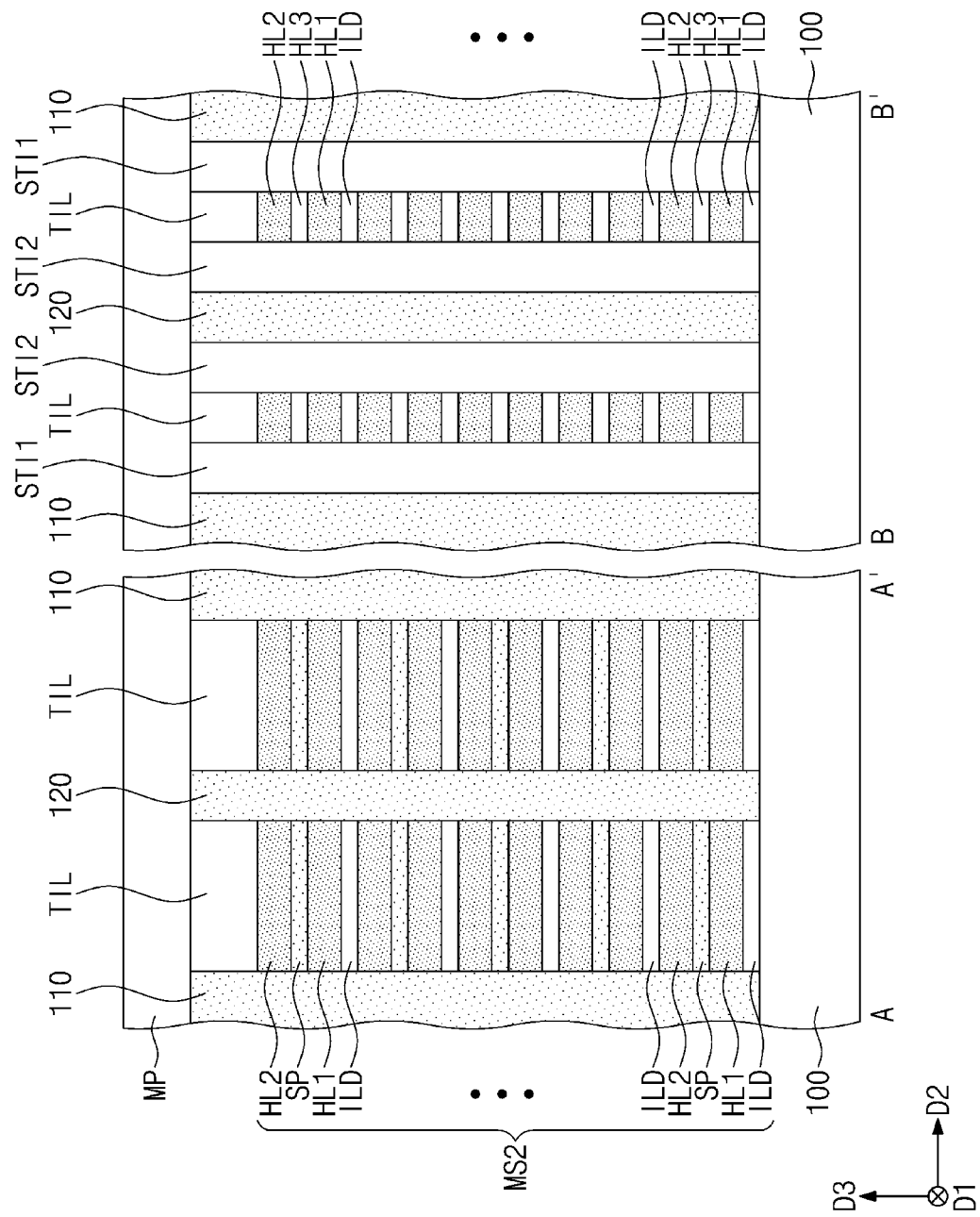
Figure 14C:
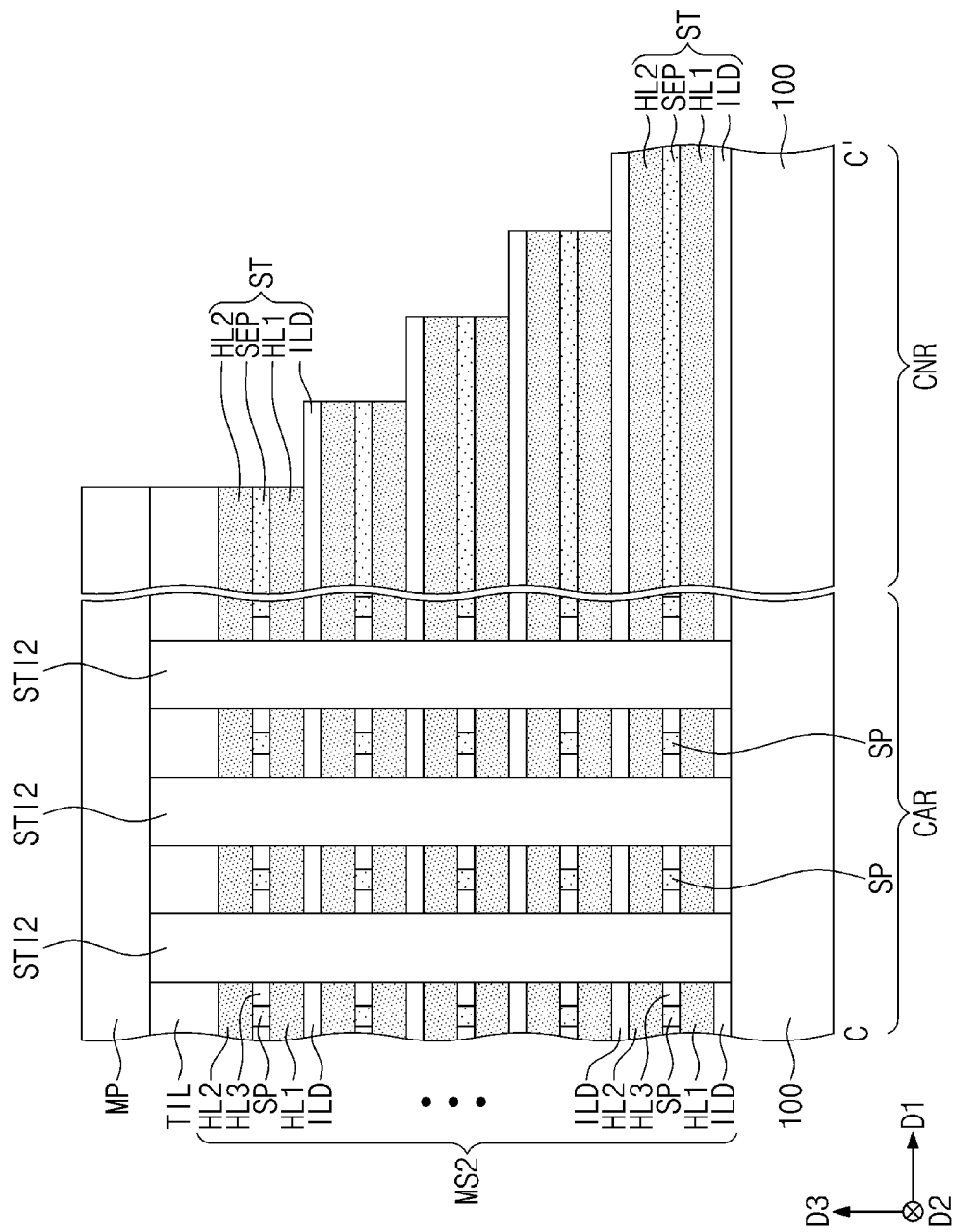

Referring to FIGS. 14A, 14B, and 14C, third sacrificial layers HL3 may be formed to fill the first horizontal regions HR1. The third sacrificial layers HL3 may be formed of or include the same material as the first and second sacrificial layers HL1 and HL2. In an embodiment, the third sacrificial layers HL3 may be formed when the first and second insulating isolation patterns STI1 and STI2 are formed, and in this case, the third sacrificial layer HL3 may be formed of or include the same insulating material as the first and second insulating isolation patterns STI1 and STI2.

As a result of the formation of the third sacrificial layers HL3, a second mold structure MS2 including the interlayer insulating layer ILD and the first to third sacrificial layers HL1, HL2, and HL3 may be formed.

Thereafter, the first and second insulating isolation patterns STI1 and STI2 may be formed by filling the first and second openings OP1 and OP2 with an insulating material. The first and second insulating separation patterns STI1 and STI2 may be formed by depositing an insulating isolation layer to fill the first and second openings OP1 and OP2 and then planarizing the insulating isolation layer to expose a top surface of the upper insulating layer TIL.

The first and second insulating isolation patterns STI1 and STI2 may be in contact with the substrate 100. The first and second insulating separation patterns STI1 and STI2 may be formed of or include at least one of insulating materials (silicon oxide and silicon oxynitride), which are formed using a spin-on-glass (SOG) technology.

After the formation of the first and second insulating isolation patterns STI1 and STI2, a staircase patterning process may be performed on the second mold structure MS2 in the connection region CNR. The staircase patterning process may include forming a mask pattern MP to cover the second mold structure MS2 in the cell array region CAR and the connection region CNR and repeatedly performing steps of etching a portion of the second mold structure MS2 and of reducing a horizontal area of the mask pattern MP. As a result of the staircase patterning process, the second mold structure MS2 on the connection region CNR may have a staircase structure formed in the first direction D1. When the formation of the staircase structure is finished, lengths of the remaining semiconductor patterns SEP may decrease with increasing distance from the substrate 100.

Figure 15A:
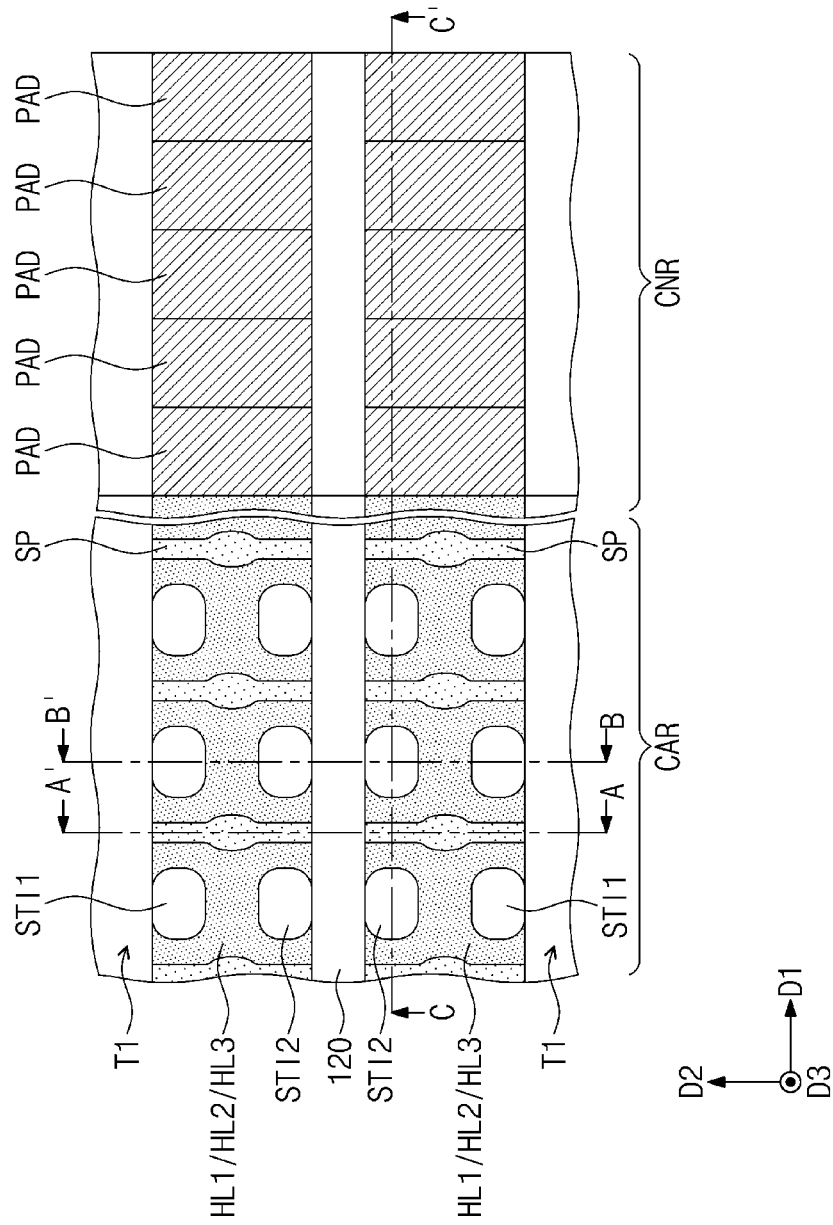
Figure 15B:
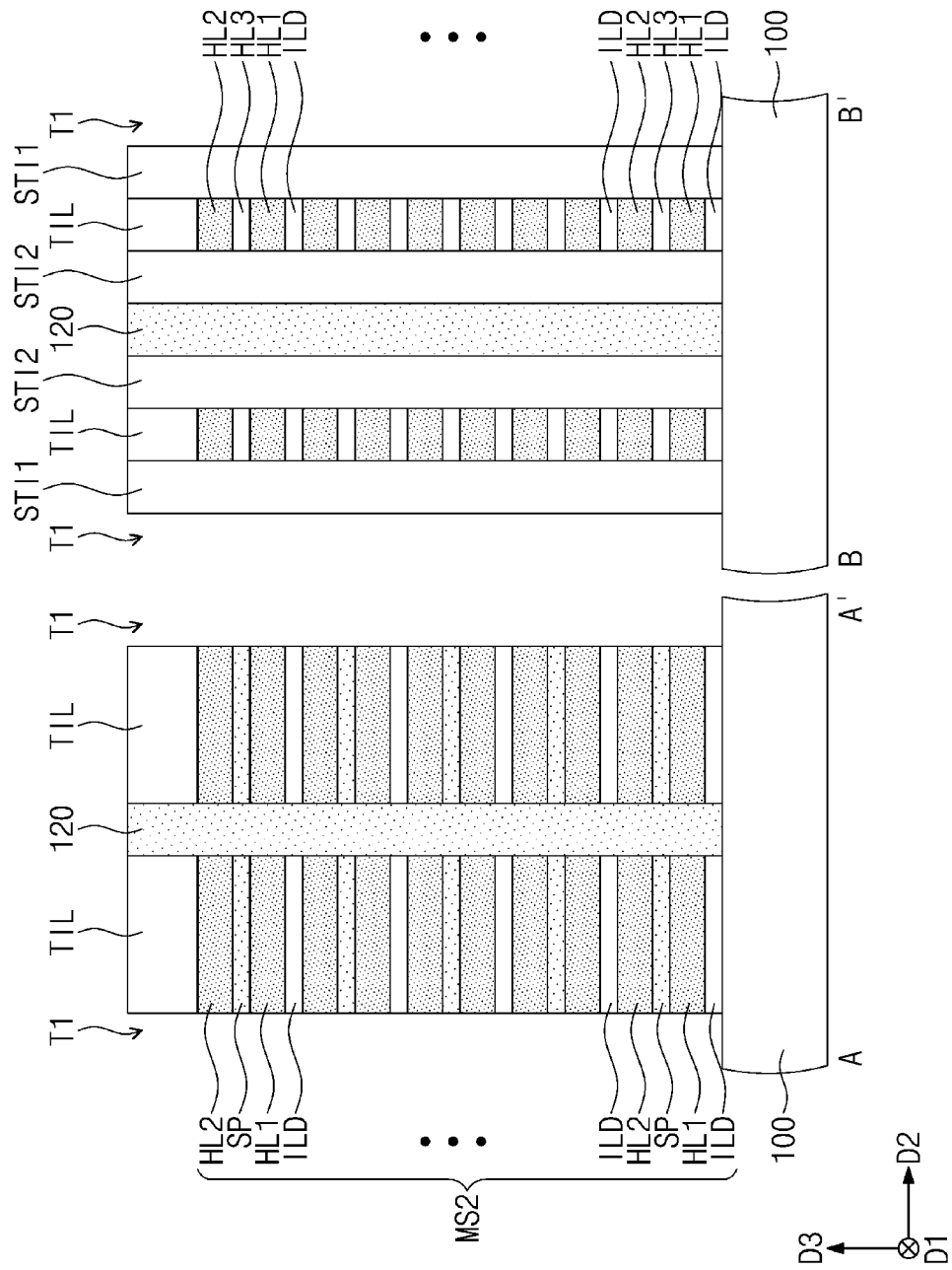
Figure 15C:
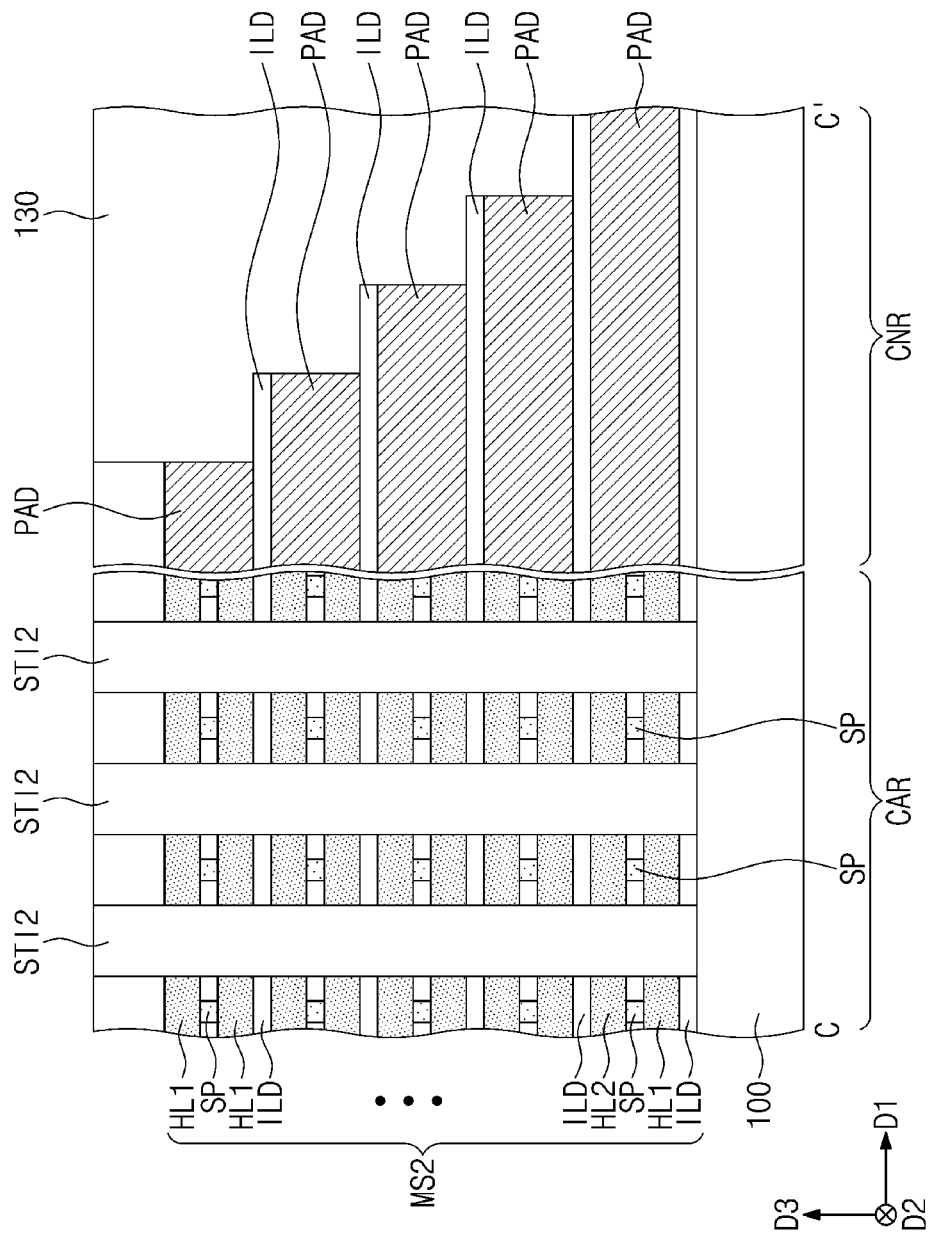

Referring to FIGS. 15A, 15B, and 15C, an end portion of each stack ST on the connection region CNR may be replaced with a conductive pad PAD. When the end portion of each stack ST is replaced with the conductive pad PAD, each of the interlayer insulating layers ILD of each stack ST may be remained. The replacement process may include forming a mask pattern (not shown) on the second mold structure MS2 to cover the cell array region CAR, forming trenches to penetrate the second mold structure MS2 on the connection region CNR and to expose the substrate 100, and performing an isotropic etching process on the first and second sacrificial layers HL1 and HL2 and the remaining semiconductor patterns SEP exposed through the trenches. Here, the trenches may be extended in the first direction D1 and may be spaced apart from each other in the second direction D2. As a result of the isotropic etching process on the first and second sacrificial layers HL1 and HL2 and the remaining semiconductor patterns SEP, empty spaces may be defined between the interlayer insulating layers ILD on the connection region CNR. Thereafter, a conductive layer may be deposited to fill the empty spaces, and then, the conductive layer may be removed from the trenches. As a result, the conductive pads PAD, which are vertically spaced apart from each other, may be formed.

The mask pattern MP may be removed, after the formation of the conductive pads PAD. Thereafter, an insulating gapfill layer 130 may be formed in the connection region CNR to cover the staircase structure of the second mold structure MS2.

After the formation of the insulating gapfill layer 130, first trenches T1 exposing the substrate 100 may be formed by removing the first insulating gapfill patterns 110 from the cell array region CAR. The first trenches T1 may be formed to expose the first and second sacrificial layers HL1 and HL2, the side surfaces of the semiconductor patterns SP, and the side surfaces of the interlayer insulating layers ILD.

The formation of the first trenches T1 may include forming the insulating gapfill layer 130 to cover the staircase structure of the second mold structure MS2 in the connection region CNR, forming a mask pattern (not shown) on the insulating gapfill layer 130 and the second mold structure MS2 to define planar positions of trenches, and anisotropically etching the second mold structure MS2 using the mask pattern as an etch mask to expose the substrate 100. The side surfaces of the first and second sacrificial layers HL1 and HL2, the side surfaces of the semiconductor patterns SP, and the side surfaces of the interlayer insulating layers ILD may be exposed to the first trenches T1.

Figure 16A:
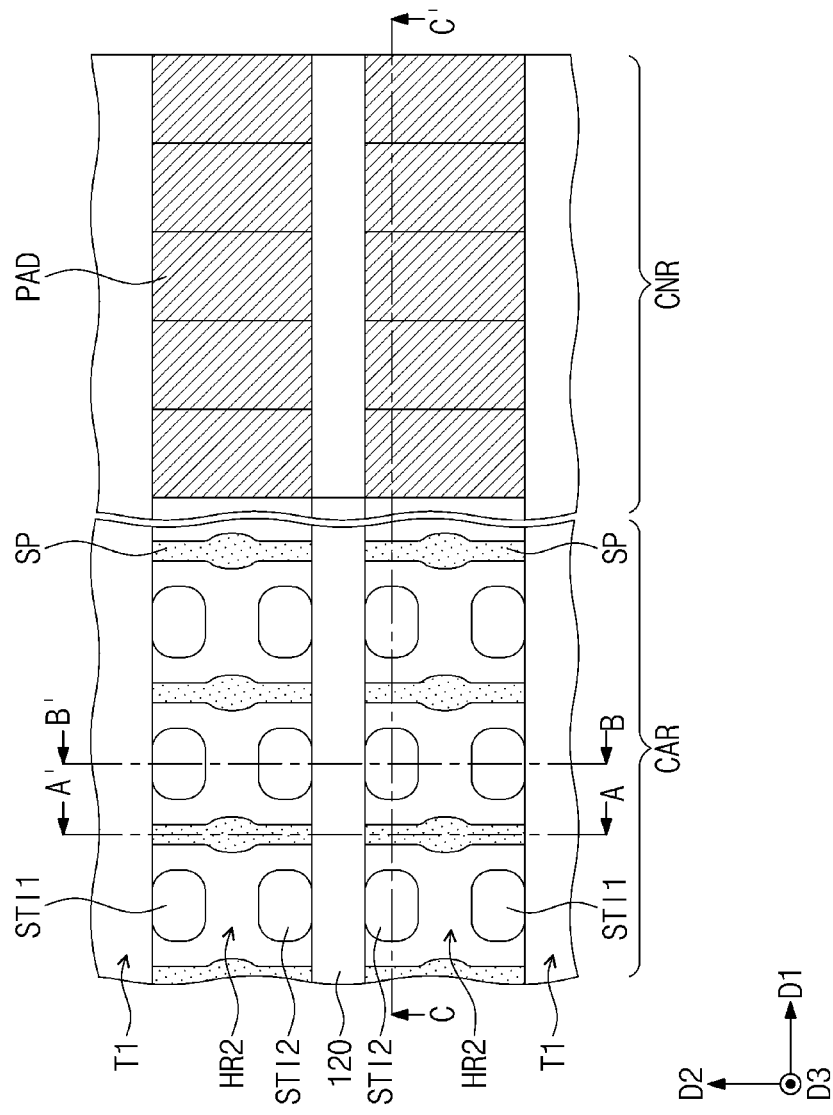
Figure 16B:
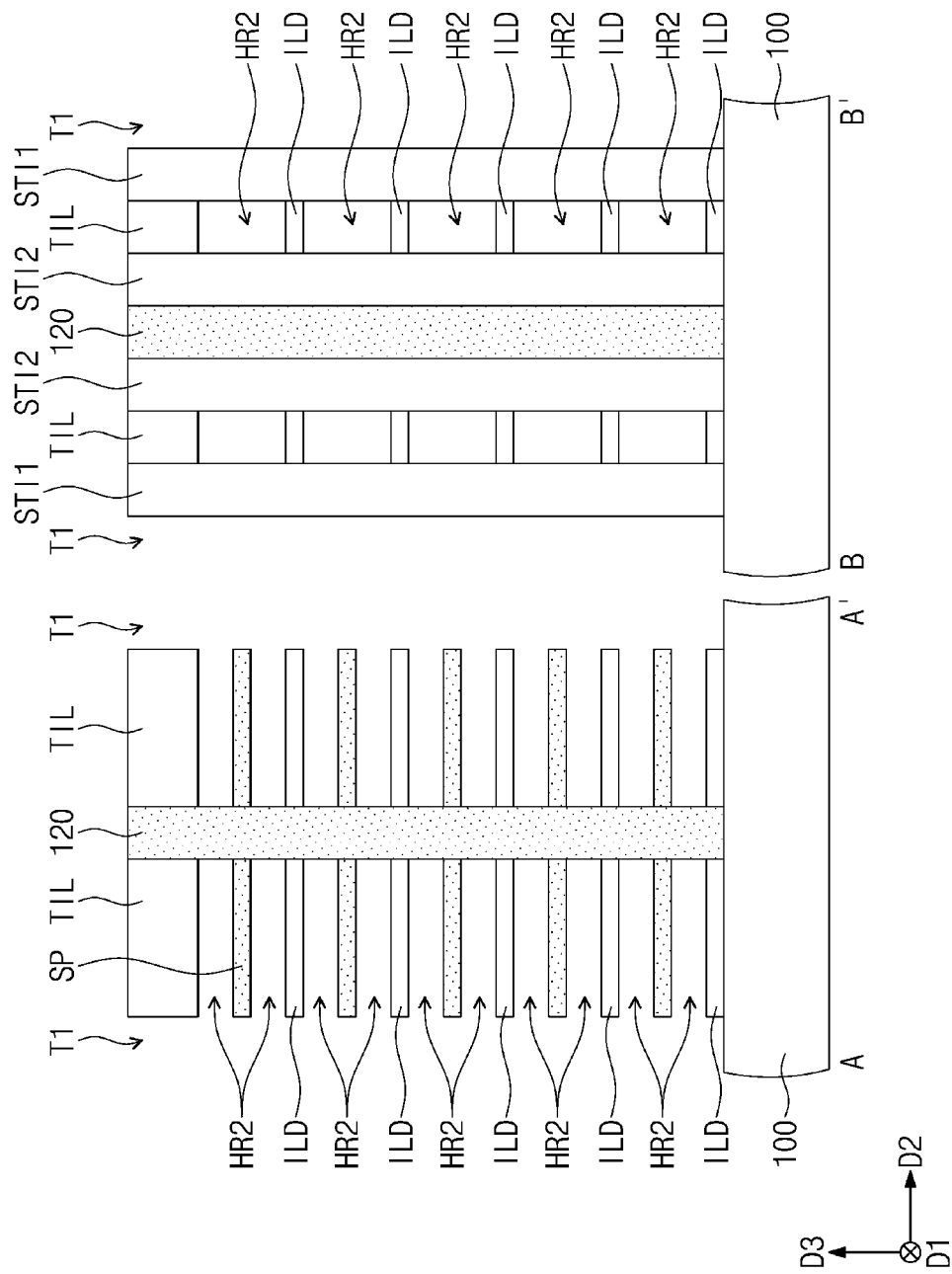
Figure 16C:
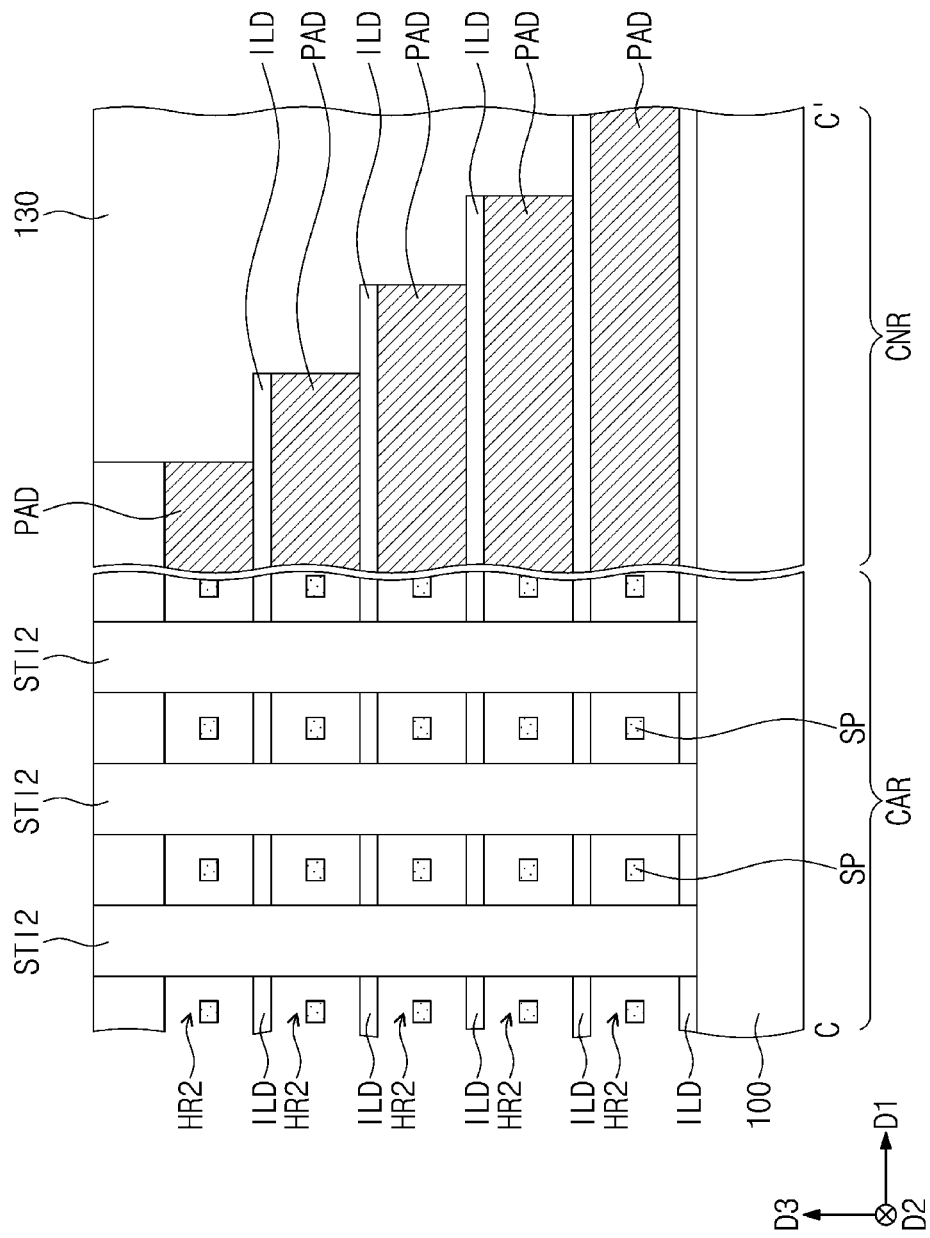

Referring to FIGS. 16A, 16B, and 16C, the first, second, and third sacrificial layers HL1, HL2, and HL3 exposed through the first trenches T1 may be partially removed to form second horizontal regions HR2 between the semiconductor patterns SP and the interlayer insulating patterns ILD.

The second horizontal regions HR2 may be formed by isotropically etching the first, second, and third sacrificial layers HL1, HL2, and HL3 using an etch recipe, which has an etch selectivity with respect to the semiconductor patterns SP and the interlayer insulating patterns ILD. For example, in the case where the first, second, and third sacrificial layers HL1, HL2, and HL3 are silicon nitride layers and the interlayer insulating patterns ILD are silicon oxide layers, the second horizontal regions HR2 may be formed by isotropically etching the first, second, and third sacrificial layers HL1, HL2, and HL3 using an etching solution containing phosphoric acid, in the etching step. The second horizontal regions HR2 may be extended in the first direction D1, between the first and second insulating isolation patterns STI1 and STI2.

In the case where the third sacrificial layer HL3 is formed of an insulating material different from the first and second sacrificial layers HL1 and HL2, the third sacrificial layers HL3 may be left in the second horizontal regions HR2.

Figure 17B:
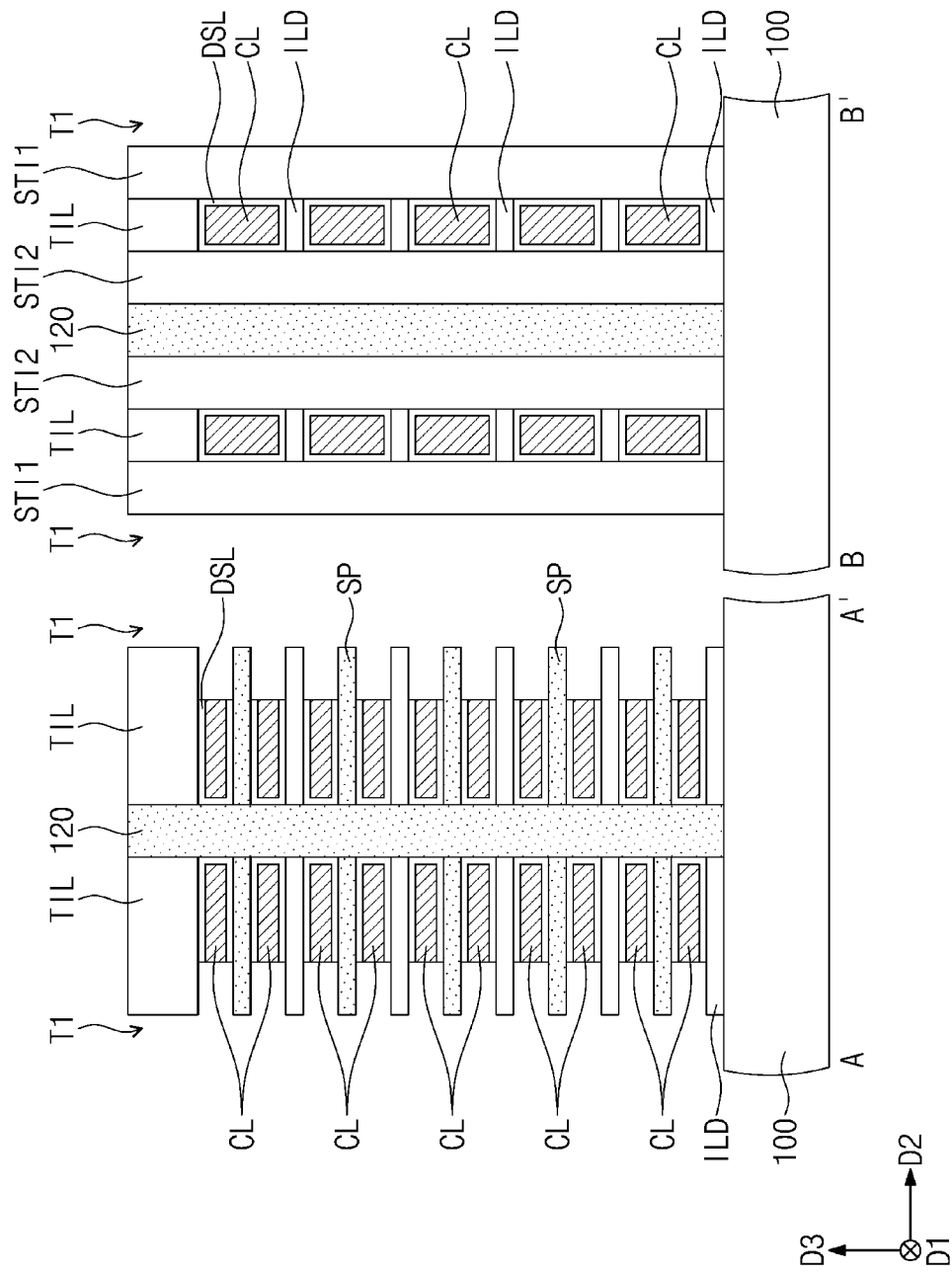
Figure 17C:
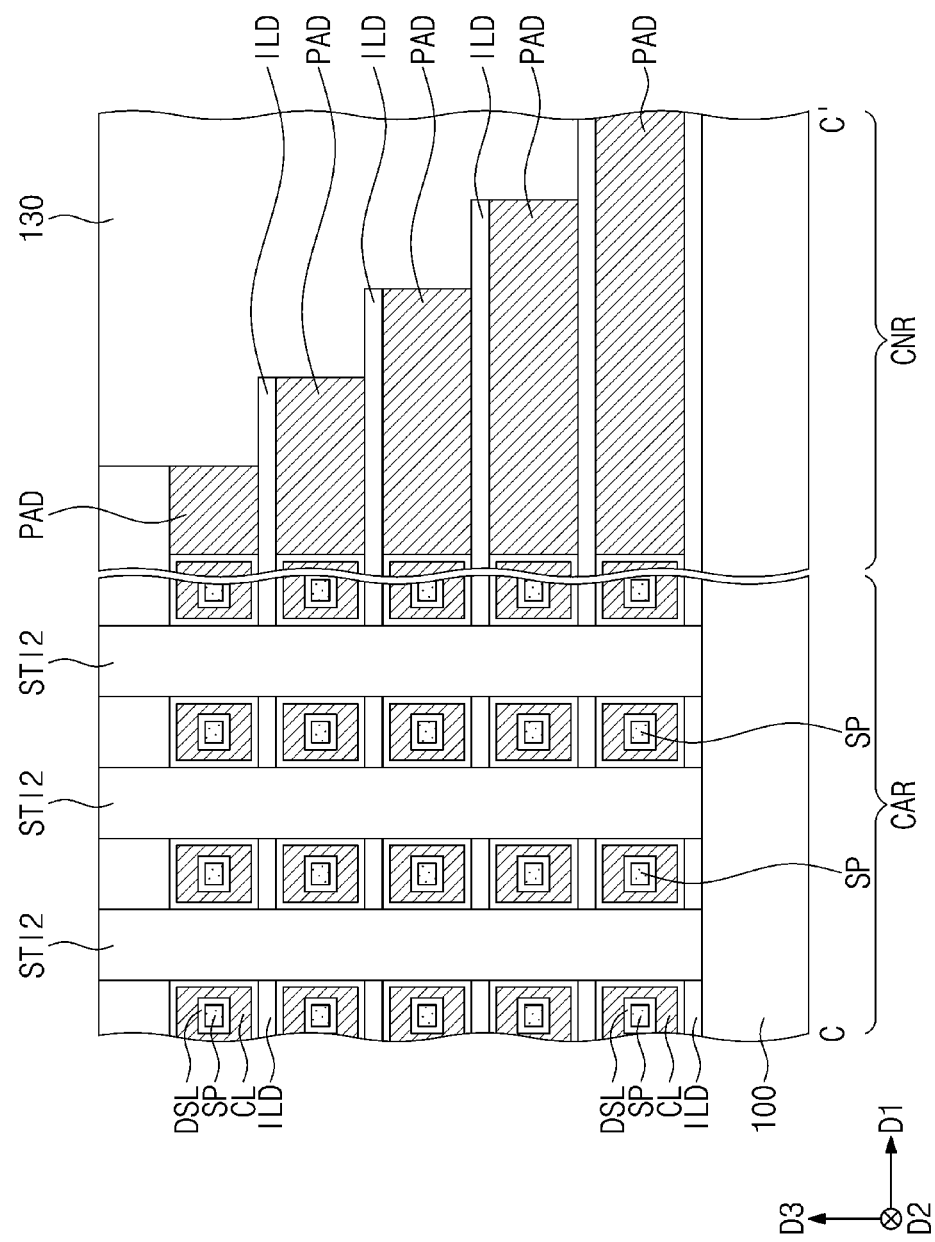

Referring to FIGS. 17A, 17B, and 17C, a data storing layer DSL and a gate conductive layer CL may be sequentially formed in the second horizontal regions HR2.

The formation of the data storing layer DSL and the gate conductive layer CL may include forming the data storing layer DSL to conformally cover the second horizontal regions HR2, forming the gate conductive layer CL on the data storing layer DSL to fill the second horizontal regions HR2, and removing the gate conductive layer CL and the data storing layer DSL from the first trenches T1 to form the gate conductive layers CL, which are vertically spaced apart from each other. Here, the side surfaces of the gate conductive layers CL may be more deeply recessed than the side surfaces of the semiconductor patterns SP and in this case, the gate conductive layers CL may partially fill the second horizontal regions HR2. The gate conductive layers CL may be extended in the first direction D1 while surrounding the semiconductor patterns SP.

By contrast, in the case where the intermediate insulating patterns are provided at the same level as the semiconductor patterns SP, each of the semiconductor patterns SP may be located between a pair of the word lines WL extending in the first direction D1.

The gate conductive layers CL may have substantially the same sidewall profile of the first insulating isolation patterns STI1, near the side surfaces of the first insulating isolation patterns STI1.

Figure 18A:
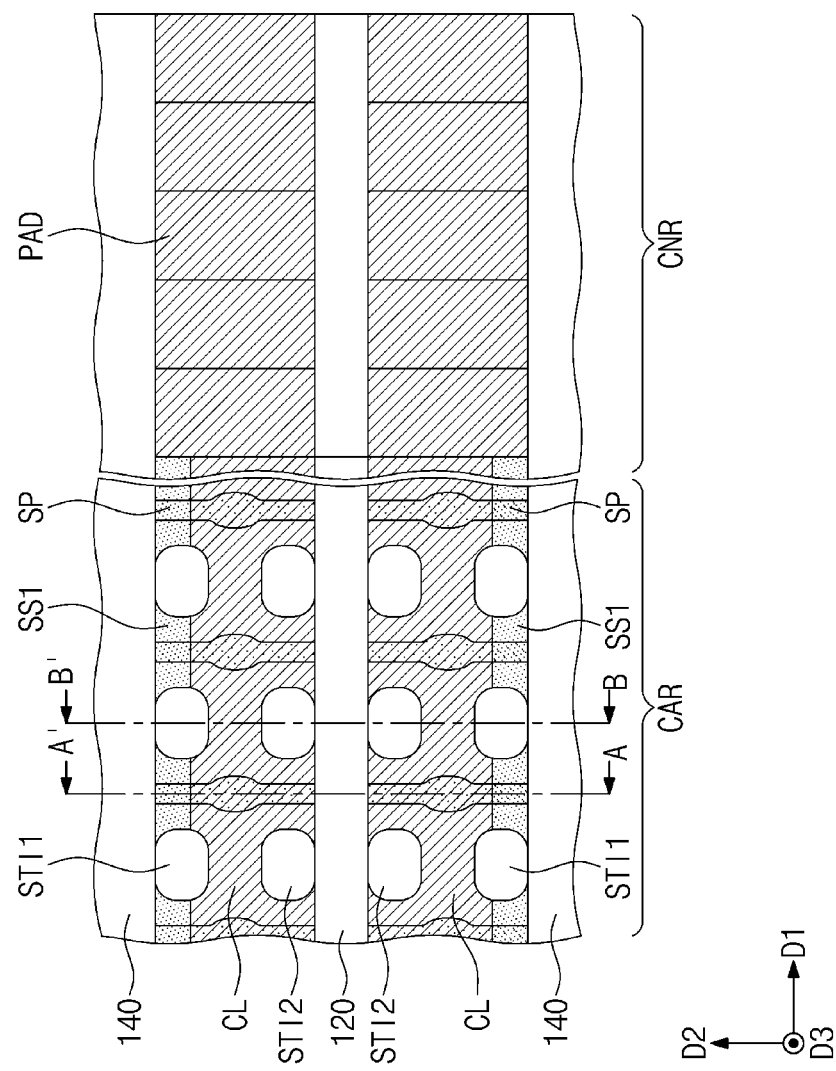
Figure 18B:
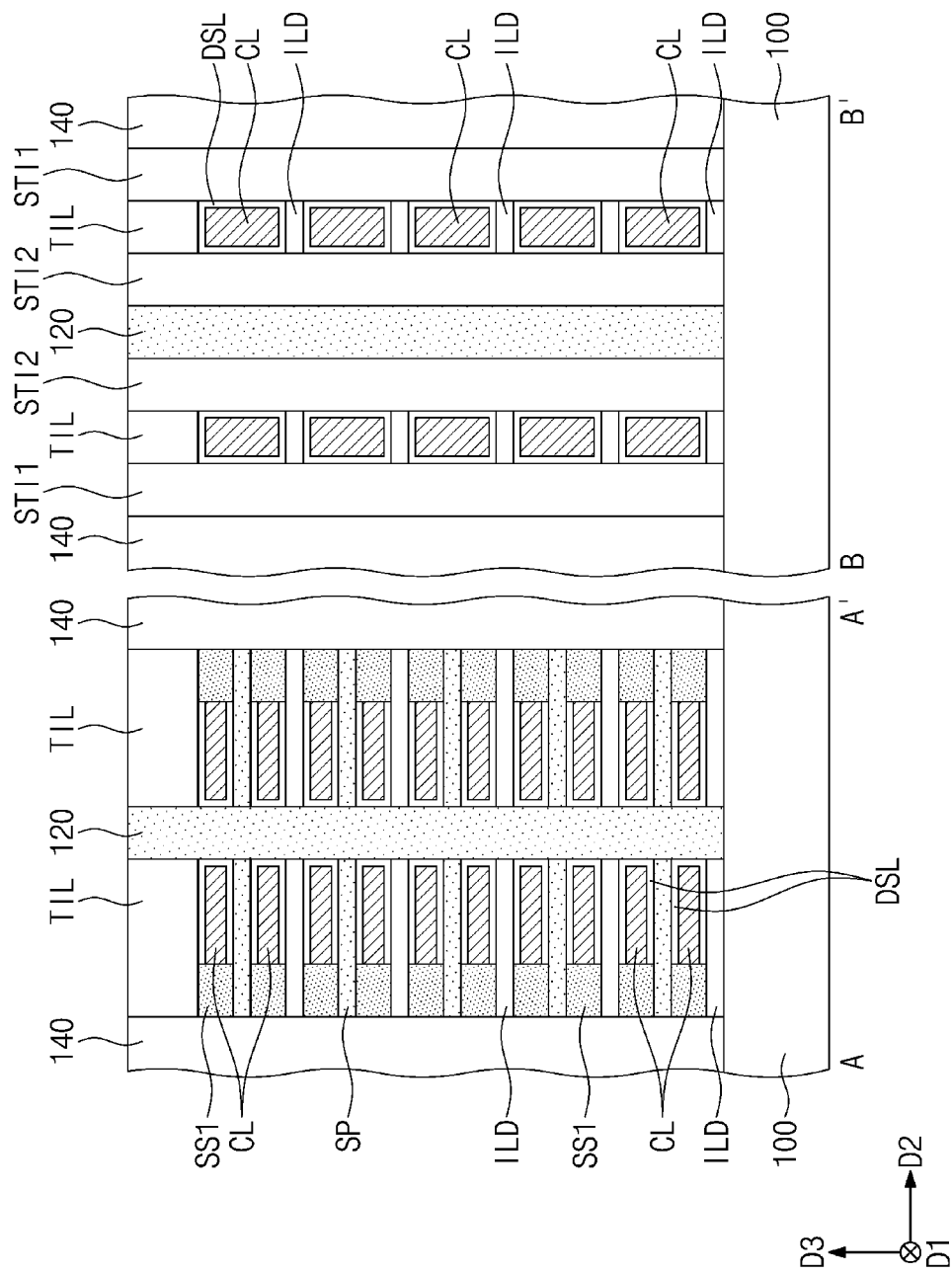

Referring to FIGS. 18A and 18B, the first spacer insulating patterns SS1 may be formed to fill the second horizontal regions HR2, in which the gate conductive layers CL are formed. The formation of the first spacer insulating patterns SS1 may include forming a spacer insulating layer on inner surfaces of the first trenches T1 to fill the second horizontal regions HR2 and removing the spacer insulating layer filling the first trenches T1 to expose the side surfaces of the interlayer insulating patterns ILD. The spacer insulating layer may be etched by an isotropic etching process, which is performed using an etch recipe having etch selectivity with respect to the interlayer insulating patterns ILD and the semiconductor patterns SP.

After the formation of the first spacer insulating patterns SS1, the bit line insulating isolation patterns 140 may be formed in the first trenches T1. The bit line insulating isolation patterns 140 may be extended in the first direction D1. The bit line insulating isolation patterns 140 may cover the side surfaces of the first spacer insulating patterns SS1 and the side surfaces of the first insulating isolation patterns STI1. The bit line insulating isolation patterns 140 may be formed of or include at least one of insulating materials (e.g., silicon oxide or silicon oxynitride), which are formed by a spin-on-glass (SOG) technology.

Before the formation of the bit line insulating isolation patterns 140, the drain regions may be formed by doping portions of the semiconductor patterns SP, which are exposed through the first trenches T1, with impurities.

Figure 19A:
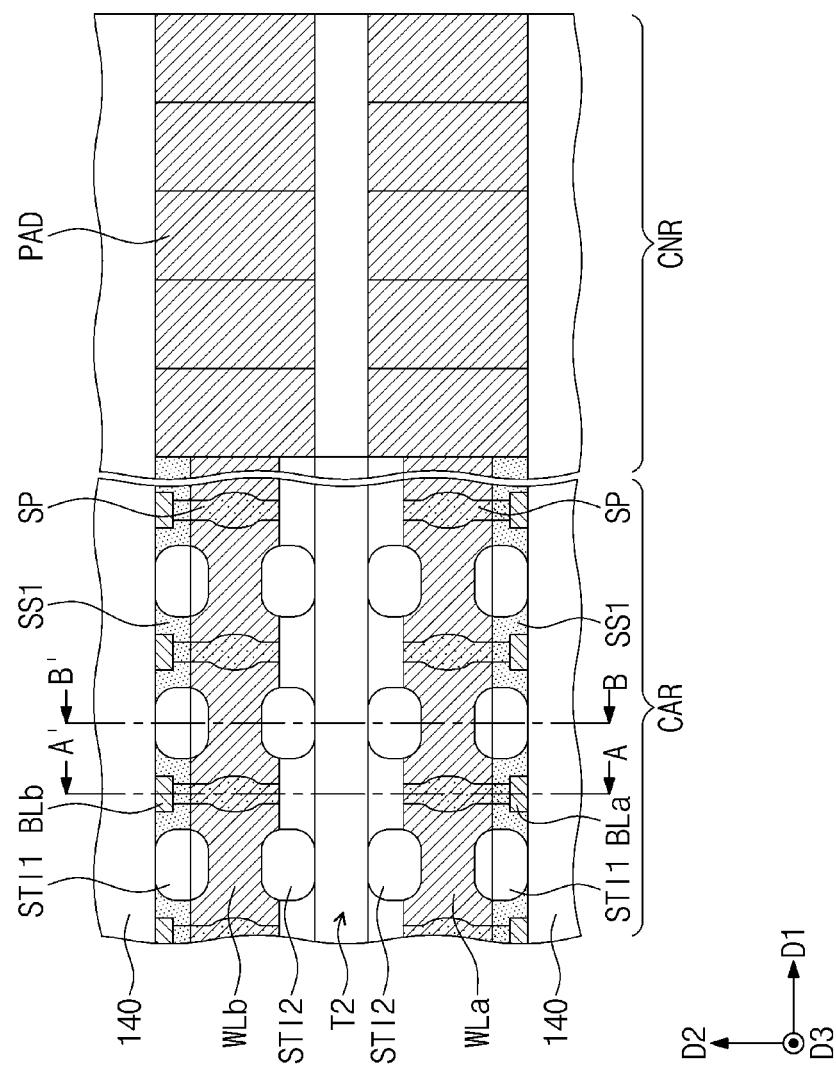

Referring to FIGS. 19A and 19B, bit lines BLa and BLb may be formed to be in contact with first side surfaces of the semiconductor patterns SP, which are disposed to be spaced apart from each other in the third direction D3.

In an embodiment, the bit lines BLa and BLb may be formed by forming a penetration hole between the first insulating isolation patterns STI1 to penetrate the first spacer insulating patterns SS1 and the semiconductor patterns SP and filling the penetration hole with a conductive material, after the formation of the bit line insulating isolation patterns 140.

The bit lines BLa and BLb, which are formed by the afore-described process, may be extended in the third direction D3 perpendicular to the top surface of the substrate 100. The bit lines BLa may be spaced apart from each other in the first direction D1 by the first insulating isolation patterns STI1. The bit lines BLb may also be spaced apart from each other in the first direction D1 by the first insulating isolation patterns STI1. Each of the bit lines BLa and BLb may be in contact with the drain regions of the semiconductor patterns SP. The bit lines BLa and BLb may be formed of or include at least one of doped silicon, metallic materials, metal nitrides, or metal silicides. For example, the bit lines BLa and BLb may be formed of or include at least one of tantalum nitride or tungsten.

Thereafter, the second trenches T2 may be formed again by removing the second insulating gapfill pattern 120. Here, portions of the data storing layer DSL and the side surfaces of the interlayer insulating patterns ILD may be exposed through the second trenches T2.

Thereafter, third horizontal regions HR3 may be respectively formed between vertically adjacent ones of the interlayer insulating patterns ILD. The formation of the third horizontal regions HR3 may include performing an etching process, which has an etch selectivity with respect to the substrate 100, the semiconductor patterns SP, and the interlayer insulating patterns ILD, to sequentially and isotropically etch portions of the data storing layer DSL and portions of the gate conductive layer CL.

Each of the third horizontal regions HR3 may be formed between the interlayer insulating patterns ILD and the semiconductor patterns SP in a vertical direction and between the second insulating isolation patterns STI2 in a horizontal direction.

As a result of the formation of the third horizontal regions HR3, data storage patterns DSP and word lines WLa and WLb may be formed. The word lines WLa and WLb may have side surfaces that are more deeply recessed compared with the side surfaces of the semiconductor patterns SP. The word lines WLa and WLb may have substantially the same sidewall profile as the second insulating isolation patterns STI2, near side surfaces of the second insulating isolation patterns STI2.

Thereafter, referring back to FIGS. 2, 3A, and 3B, the second spacer insulating patterns SS2 may be formed to fill the third horizontal regions HR3. The formation of the second spacer insulating patterns SS2 may include forming a spacer insulating layer on inner surfaces of the second trenches T2 to fill the third horizontal regions HR3 and removing the spacer insulating layer filling the second trenches T2 to expose the side surfaces of the interlayer insulating patterns ILD. The spacer insulating layer may be etched by an isotropic etching process, which has an etch selectivity with respect to the interlayer insulating patterns ILD and the semiconductor patterns SP.

After the formation of the second spacer insulating patterns SS2, the source lines SL and the source line insulating isolation patterns 150 may be formed in the second trenches T2. The source lines SL may be formed by filling a conductive layer to fill the second trenches T2 and patterning the conductive layer. In an embodiment, before the formation of the source lines SL, the source regions may be formed by doping portions of the semiconductor patterns SP, which are exposed through the second trenches T2, with impurities.

The source line insulating isolation patterns 150 may be formed by forming an insulating layer to fill the second trench T2 provided with the source lines SL, using deposition and planarization processes. The source line insulating isolation patterns 150 may cover the side surfaces of the second insulating isolation patterns STI2.

According to an embodiment of the inventive concept, a semiconductor memory device may include memory cells, which are three-dimensionally arranged, and each of which includes a ferroelectric field effect transistor, and thus, the semiconductor memory device may have nonvolatile and high-speed operation properties. Accordingly, it may be possible to increase an integration density of the semiconductor memory device and to improve electric characteristics of the semiconductor memory device.

Furthermore, a mold structure, which includes sacrificial layers and polycrystalline semiconductor layers, may be used to form a channel region and a word line of the ferroelectric field effect transistor of the semiconductor memory device. Thus, it may be possible to reduce a difficulty in fabricating a semiconductor memory device.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor memory device, comprising:
a stack including word lines and interlayer insulating patterns, which are alternatingly stacked on a substrate, the word lines extended in a first direction parallel to a top surface of the substrate;
semiconductor patterns crossing the word lines and having a long axis extended in a second direction parallel to the top surface of the substrate;
data storage patterns respectively interposed between the semiconductor patterns and the word lines, in a third direction perpendicular to the top surface of the substrate, the data storage patterns comprising a ferroelectric material;
bit lines, which are extended in the third direction and are spaced apart from each other in the first direction, each of the bit lines being in contact with first side surfaces of the semiconductor patterns spaced apart from each other in the third direction; and
a source line contacting in common second side surfaces of the semiconductor patterns, which are opposite to the first side surfaces in the second direction and are spaced apart from each other in the third direction,
wherein the data storage patterns surround portions of the semiconductor patterns, respectively.

2. The semiconductor memory device of claim 1, wherein the semiconductor patterns are formed of poly silicon.

3. The semiconductor memory device of claim 1, wherein the word lines are extended in the first direction, and
wherein each of the word lines surrounds portions of the semiconductor patterns located at the same level.

4. The semiconductor memory device of claim 1, further comprising gate insulating layers, which are respectively disposed between the data storage patterns and the semiconductor patterns.

5. The semiconductor memory device of claim 4, further comprising intermediate conductive patterns, which are respectively disposed between the gate insulating layers and the data storage patterns.

6. The semiconductor memory device of claim 1, wherein the data storage patterns are provided to surround the semiconductor patterns, respectively.

7. The semiconductor memory device of claim 1, wherein the data storage patterns include portions interposed between the interlayer insulating patterns and the word lines.

8. The semiconductor memory device of claim 1, wherein the ferroelectric material comprises $HfO_2$, $HfSiO_2$ (Si-doped $HfO_2$), $HfAlO_2$ (Al-doped $HfO_2$), HfSiON, HfZnO, $HfZrO_2$, $ZrO_2$, $ZrSiO_2$, $HfZrSiO_2$, ZrSiON, LaAlO, $HfDyO_2$, or $HfScO_2$.

9. The semiconductor memory device of claim 1, wherein each of the semiconductor patterns comprises source and drain regions, which are spaced apart from each other in the second direction, and a channel region therebetween, and
wherein a width, in the first direction, of each of the semiconductor patterns is greater at the channel region than at the source and drain regions.

10. The semiconductor memory device of claim 1, wherein each of the word lines includes a first portion having a first width in the second direction, and a second portion having a second width greater than the first width in the second direction, and
wherein the second portion of each of the word lines surrounds a corresponding semiconductor pattern located at the same level.

11. The semiconductor memory device of claim 1, wherein each of the semiconductor patterns comprises source and drain regions, which are spaced apart from each other in the second direction, and a channel region therebetween, the semiconductor memory device further comprising:
first insulating isolation patterns disposed between the drain regions of the semiconductor patterns, which are adjacent to each other in the first direction; and
second insulating isolation patterns disposed between the source regions of the semiconductor patterns, which are adjacent to each other in the first direction,
wherein the first and second insulating isolation patterns are extended in the third direction to penetrate the stack.

12. The semiconductor memory device of claim 1, wherein the source line is extended in the first direction.

13. A semiconductor memory device, comprising:
a semiconductor pattern having a long axis, which is extended in a second direction parallel to a top surface of a substrate;
a word line fully surrounding a portion of the semiconductor pattern and extended in a first direction perpendicular to the second direction and parallel to the top surface of the substrate;
a bit line contacting a first side surface of the semiconductor pattern and extended in a third direction perpendicular to the top surface of the substrate;
a source line contacting a second side surface of the semiconductor pattern opposite to the first side surface in the second direction and extended in the third direction; and
a data storage pattern disposed between the semiconductor pattern and the word line in the third direction.

14. The semiconductor memory device of claim 13, wherein the data storage pattern includes an inner portion surrounding the semiconductor pattern and an outer portion extended along top and bottom surfaces of the word line.

15. The semiconductor memory device of claim 13, wherein the word line includes a first portion having a first width in the second direction, and a second portion having a second width greater than the first width in the second direction, and
wherein the second portion of the word line surrounds the semiconductor pattern.

16. The semiconductor memory device of claim 13, wherein the data storage pattern comprises a ferroelectric material.

17. The semiconductor memory device of claim 13, further comprising a gate insulating layer disposed between the data storage pattern and the semiconductor pattern.

18. A semiconductor memory device, comprising:
a first stack extending in a first direction and comprising first interlayer insulating patterns and first word lines, which are alternately stacked on a substrate;
a second stack extending in the first direction and comprising second interlayer insulating patterns and second word lines, which are alternately stacked on the substrate;
first semiconductor patterns crossing the first word lines and having a long axis extended in a second direction perpendicular to the first direction and parallel to a top surface of the substrate;
first ferroelectric layers surrounding the first semiconductor patterns;
first gate insulating layers between the first semiconductor patterns and the first ferroelectric layer;
second semiconductor patterns crossing the second word lines and having a long axis extended in the second direction;
second ferroelectric layers surrounding the second semiconductor patterns;
second gate insulating layers between the second semiconductor patterns and the second ferroelectric layers;
first bit lines extended in a third direction perpendicular to the top surface of the substrate and spaced apart from each other in the first direction, each of the first bit lines contacting first side surfaces of the first semiconductor patterns spaced apart from each other in the third direction;
second bit lines extended in the third direction perpendicular to the top surface of the substrate and spaced apart from each other in the first direction, each of the second bit lines contacting first side surfaces of the second semiconductor patterns spaced apart from each other in the third direction;
a source line extended in the third direction between the first and second stacks, the source line contacting in common second side surfaces of the first semiconductor patterns spaced apart from each other in the third direction and second side surfaces of the second semiconductor patterns spaced apart from each other in the third direction;
first insulating isolation patterns disposed between the first bit lines adjacent to each other in the first direction and between the second bit lines adjacent to each other in the first direction and extended in the third direction; and
second insulating isolation patterns spaced apart from the first insulating isolation patterns in the second direction and extended in the third direction.

19. The semiconductor memory device of claim 18, wherein each of the first word lines surrounds portions of the first semiconductor patterns located at the same level, and
wherein each of the second word lines surrounds portions of the second semiconductor patterns located at the same level.

20. The semiconductor memory device of claim 18, wherein each word line of the first and second word lines includes a first portion having a first width in the second direction and a second portion having a second width greater than the first width in the second direction,
wherein the second portion of each of the first word lines surrounds a corresponding first semiconductor pattern, and
wherein the second portion of each of the second word lines surrounds a corresponding second semiconductor pattern.

* * * * *